United States Patent
Kim et al.

(10) Patent No.: US 10,069,098 B2
(45) Date of Patent: Sep. 4, 2018

(54) ORGANIC LIGHT EMITTING DISPLAY DEVICE, METHOD OF MANUFACTURING THE SAME, AND HEAD MOUNTED DISPLAY INCLUDING THE SAME

(71) Applicant: LG Display Co., Ltd., Seoul (KR)

(72) Inventors: JongSung Kim, Paju-si (KR); ChoongKeun Yoo, Gimpo-si (KR); Ho-Jin Kim, Goyang-si (KR); TaeHan Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/383,887

(22) Filed: Dec. 19, 2016

(65) Prior Publication Data

US 2018/0006258 A1  Jan. 4, 2018

(30) Foreign Application Priority Data

Jun. 29, 2016 (KR) .................. 10-2016-0081798
Sep. 23, 2016 (KR) .................. 10-2016-0121963

(51) Int. Cl.
*H01L 51/52* (2006.01)
*G02B 17/02* (2006.01)
*H01L 27/32* (2006.01)
*H01L 51/56* (2006.01)

(52) U.S. Cl.
CPC ........ *H01L 51/5203* (2013.01); *G02B 17/026* (2013.01); *H01L 27/3246* (2013.01); *H01L 27/3248* (2013.01); *H01L 27/3258* (2013.01); *H01L 51/56* (2013.01)

(58) Field of Classification Search
CPC .................................................. G02B 17/026
See application file for complete search history.

(56) References Cited

U.S. PATENT DOCUMENTS

| 5,808,802 | A | 9/1998 | Hur |
| 9,620,733 | B2 * | 4/2017 | Kim ................ H01L 51/5212 |
| 2005/0082534 | A1 | 4/2005 | Kim et al. |
| 2006/0208977 | A1 | 9/2006 | Kimura |
| 2007/0170857 | A1 | 7/2007 | Choi et al. |
| 2011/0057187 | A1 | 3/2011 | Sakakura et al. |
| 2011/0210324 | A1 | 9/2011 | Sakakura et al. |
| 2013/0056784 | A1 * | 3/2013 | Lee ................... H01L 27/3246 257/99 |

(Continued)

FOREIGN PATENT DOCUMENTS

| GB | 2319424 | 5/1998 |
| JP | 2005197027 | 7/2005 |

(Continued)

*Primary Examiner* — Lex Malsawma
(74) *Attorney, Agent, or Firm* — Fenwick & West LLP

(57) ABSTRACT

In one embodiment, a display device comprises: a substrate including an emissive area that emits light and a non-emissive area that does not emit light; a transistor over the substrate; a light emitting device over the transistor, the light emitting device including a first electrode, a light emitting layer on the first electrode, and a second electrode on the light emitting layer; a contact hole in the emissive area of the substrate, the contact hole positioned between the transistor and the light emitting device; and an auxiliary electrode in the contact hole, the auxiliary electrode electrically connecting together the first electrode of the light emitting device and the transistor.

20 Claims, 21 Drawing Sheets

(56) References Cited

U.S. PATENT DOCUMENTS

| | | |
|---|---|---|
| 2015/0053955 A1 | 2/2015 | Furuie et al. |
| 2015/0102291 A1 | 4/2015 | Park et al. |
| 2015/0221839 A1 | 8/2015 | Park et al. |
| 2016/0020422 A1* | 1/2016 | Kim .................. H01L 51/5228 257/40 |
| 2016/0043154 A1 | 2/2016 | Choi et al. |
| 2016/0079322 A1 | 3/2016 | Kim et al. |
| 2016/0190225 A1* | 6/2016 | Kim .................. H01L 27/3276 257/40 |
| 2016/0343784 A1 | 11/2016 | Shi et al. |
| 2016/0351638 A1* | 12/2016 | Im .................. H01L 27/3246 |
| 2017/0062548 A1* | 3/2017 | Han .................. H01L 27/3276 |

FOREIGN PATENT DOCUMENTS

| | | |
|---|---|---|
| JP | 2008130363 | 6/2008 |
| JP | 2010287543 | 12/2010 |
| WO | WO 2016012466 | 1/2016 |
| WO | WO 2016095330 | 6/2016 |
| WO | WO2016167354 | 10/2016 |

\* cited by examiner

ORGANIC LIGHT EMITTING DISPLAY DEVICE, METHOD OF MANUFACTURING THE SAME, AND HEAD MOUNTED DISPLAY INCLUDING THE SAME

CROSS-REFERENCE TO RELATED APPLICATIONS

This application claims the benefit of Korean Patent Application No. 10-2016-0081798 filed on Jun. 29, 2016 and Korean Patent Application No. 10-2016-0121963 filed on Sep. 23, 2016, which are hereby incorporated by reference as if fully set forth herein.

BACKGROUND

Field of Technology

The present disclosure relates to an organic light emitting display device, a method of manufacturing the same, and a head-mounted display (HMD) including the same.

Discussion of the Related Art

With the advancement of information-oriented society, various requirements for display devices for displaying an image are increasing. Therefore, various display devices such as liquid crystal display (LCD) devices, plasma display panel (PDP) devices, organic light emitting display devices, etc. are recently being used.

As a type of display device, organic light emitting display devices are self-emitting display devices and are better in viewing angle and contrast ratio than LCD devices. Also, since the organic light emitting display devices do not need a separate backlight, it is possible to lighten and thin the organic light emitting display devices, and the organic light emitting display devices are excellent in power consumption. Furthermore, the organic light emitting display devices are driven with a low direct current (DC) voltage, have a fast response time, and are low in manufacturing cost.

The organic light emitting display devices each include anode electrodes, a bank that divides the anode electrodes, a hole transporting layer, an organic light emitting layer, and an electron transporting layer that are formed on the anode electrodes, and a cathode electrode formed on the electron transporting layer. In this case, when a high-level voltage is applied to the anode electrode and a low-level voltage is applied to the cathode electrode, a hole and an electron respectively move to the organic light emitting layer through the hole transporting layer and the electron transporting layer and are combined with each other in the organic light emitting layer to emit light.

In the organic light emitting display devices, an area where an anode electrode, an organic light emitting layer, and a cathode electrode are sequentially stacked is an emissive area that emits light, and an area where a bank is provided is a non-emissive area that does not emit light. The bank defines the emissive area.

The anode electrode is connected to a source or drain electrode of a thin-film transistor (TFT) through a contact hole and is supplied with a high-level voltage. Due to a step height of the contact hole, it is difficult for the organic light emitting layer to be uniformly deposited in the contact hole, and thus, the organic light emitting layer is not formed in the contact hole. That is, the contact hole is covered by the bank.

Recently, since small organic light emitting display devices applied to mobile devices and the like have a high resolution, a pixel size is progressively reduced. However, the contact hole is formed through a photo process, and due to a limitation of the photo process, the contact hole cannot be formed to less than a certain size. That is, despite the pixel size being reduced, there is a limitation in reducing the contact hole.

The contact hole is disposed in the non-emissive area, and thus, if the pixel size is reduced, an area ratio of the non-emissive area becomes higher, and an area ratio of the emissive area becomes lower. If the area ratio of the emissive area becomes lower, the emission luminance of the emissive area should increase, and for this reason, a lifetime of the organic light emitting layer is reduced.

Recently, head-mounted displays each including an organic light emitting display device are being developed. The head-mounted displays are glasses-type monitor devices for virtual reality (VR), which are worn in a glasses type or a helmet type and form a focal point at a distance close to eyes of a user. However, in the head-mounted displays, an image displayed by the organic light emitting display device is seen in just front of eyes of a user, and for this reason, if a ratio of an area occupied by a non-emissive area in each pixel is high, the non-emissive area is seen in a lattice pattern as illustrated in FIG. 1.

SUMMARY

Accordingly, the present disclosure is directed to provide an organic light emitting display device, a method of manufacturing the same, and a head-mounted display (HMD) including the same that substantially obviate one or more problems due to limitations and disadvantages of the related art.

An aspect of the present disclosure is directed to provide an organic light emitting display device, a method of manufacturing the same, and an HMD including the same, in which a lifetime of an organic light emitting layer is improved.

Another aspect of the present disclosure is directed to provide an organic light emitting display device, a method of manufacturing the same, and an HMD including the same, which prevent a non-emissive area from being seen in a lattice pattern.

In one embodiment, a display device comprises: a substrate including an emissive area that emits light and a non-emissive area that does not emit light; a transistor over the substrate; a light emitting device over the transistor, the light emitting device including a first electrode, a light emitting layer on the first electrode, and a second electrode on the light emitting layer; a contact hole in the emissive area of the substrate, the contact hole positioned between the transistor and the light emitting device; and an auxiliary electrode in the contact hole, the auxiliary electrode electrically connecting together the first electrode of the light emitting device and the transistor.

In one embodiment, a method of manufacturing a display device comprises: forming a substrate including an emissive area that emits light and a non-emissive area that does not emit light; forming a transistor over the substrate; forming a light emitting device over the transistor, the light emitting device formed to include a first electrode, a light emitting layer on the first electrode, and a second electrode on the light emitting layer; forming a contact hole in the emissive area of the substrate, the contact hole formed between the transistor and the light emitting device; forming an auxiliary electrode in the contact hole, the auxiliary electrode electrically connecting together the first electrode of the light emitting device and the transistor.

In one embodiment, a display device comprises: a substrate including an emissive area that emits light and a non-emissive area that does not emit light; a transistor over the substrate, the transistor including a first electrode, a second electrode, and a gate electrode; a planarization layer on the transistor; a contact hole in a portion of the planarization layer that is in the emissive area of the substrate, the contact hole exposing a portion of the first electrode of the transistor; an auxiliary electrode over the planarization layer, the auxiliary electrode filling in at least a portion of the contact hole and the auxiliary electrode in contact with the exposed portion of the first electrode of the transistor; and a light emitting device on the auxiliary electrode, the first electrode of the light emitting device electrically connected to the first electrode of the transistor via the auxiliary electrode.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device In another aspect of the present invention, there is provided a method of manufacturing an organic light emitting display device It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
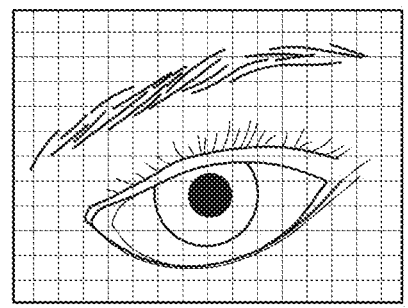
FIG. 1 is an exemplary diagram illustrating a lattice pattern of an image displayed by a related art HMD.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein.

Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

An X axis direction, a Y axis direction, and a Z axis direction should not be construed as only a geometric relationship where a relationship there between is vertical, and may denote having a broader directionality within a scope where elements of the present invention operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

Figure 2:
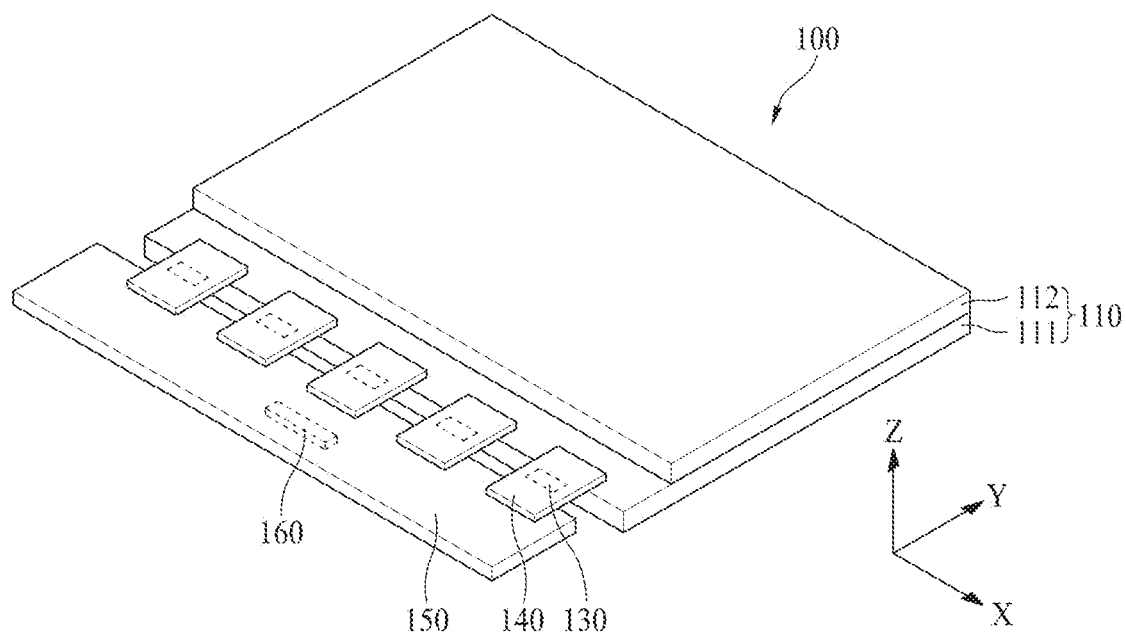
FIG. 2 is a perspective view illustrating an organic light emitting display device according to an embodiment of the present disclosure.
Figure 3:
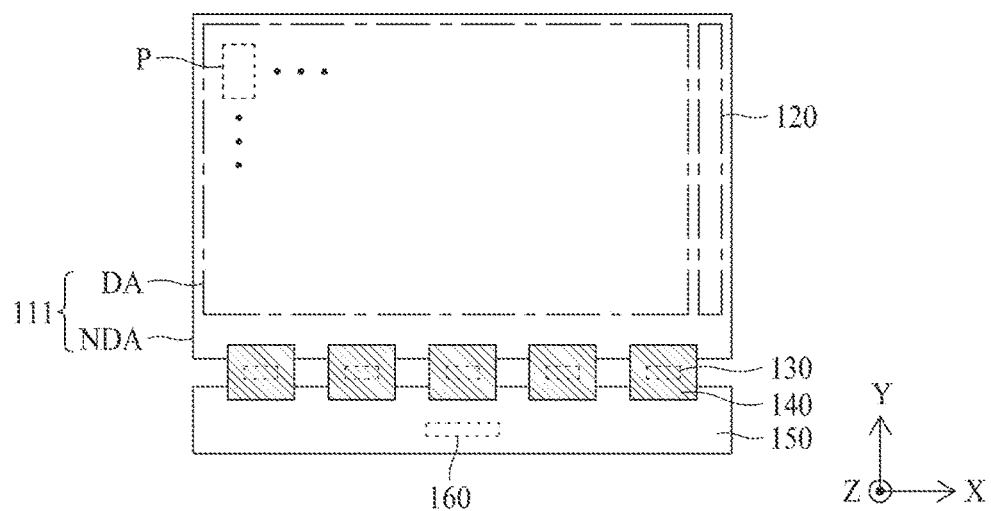
FIG. 3 is a plan view illustrating a first substrate, a gate driver, a source drive integrated circuit (IC), a flexible film, a circuit board, and a timing controller of FIG. 2 according to an embodiment of the present disclosure.

FIG. 2 is a perspective view illustrating an organic light emitting display device 100 according to an embodiment of the present disclosure. FIG. 3 is a plan view illustrating a first substrate, a gate driver, a source drive integrated circuit (IC), a flexible film, a circuit board, and a timing controller of FIG. 2 according to one embodiment of the present disclosure.

Referring to FIGS. 2 and 3, the organic light emitting display device 100 according to an embodiment of the present disclosure may include a display panel 110, a gate driver 120, a source driver IC 130, a flexible film 140, a circuit board 150, and a timing controller 160.

The display panel 110 may include a first substrate 111 and a second substrate 112. The second substrate 112 may be an encapsulation substrate. The first substrate 111 and the second substrate 112 may each be plastic or glass.

A plurality of gate lines, a plurality of data lines, and a plurality of pixels P may be provided on one surface of the first substrate 111 facing the second substrate 112. The pixels P may be respectively provided in a plurality of areas defined by intersections of the gate lines and the date lines.

Each of the pixels P may include a thin-film transistor (TFT) and an organic light emitting device which includes a first electrode, an organic light emitting layer, and a second electrode. In general, the TFT may be replaced by any kind of suitable transistor. By way of example, the transistor may include a first controlled electrode (e.g. a source electrode in the case of a field effect transistor), a second controlled electrode (e.g. a drain electrode in the case of a field effect transistor), and a control electrode (e.g. a gate electrode in the case of a field effect transistor) controlling a current flow between the first controlled electrode and the second controlled electrode. When a gate signal is input through a gate line, each of the pixels P may supply a certain current to the organic light emitting device by using the TFT according to a data voltage supplied through a data line. Therefore, the organic light emitting device of each of the pixels P may emit light having certain brightness according to the certain current. Each of the pixels P will be described in detail with reference to FIG. 4.

The display panel 110, as illustrated in FIG. 3, may be divided into a display area DA, where the pixels P are provided to display an image, and a non-display area NDA which does not display an image. The gate lines, the data lines, and the pixels P may be provided in the display area DA. The gate driver 120 and a plurality of pads may be provided in the non-display area NDA.

The gate driver 120 may sequentially supply gate signals to the gate lines according to a gate control signal input from the timing controller 160. The gate driver 120 may be provided in the non-display area NDA outside one side or both sides of the display area DA of the display panel 110 in a gate driver-in panel (GIP) type. Alternatively, the gate driver 120 may be manufactured as a driving chip and may be mounted on a flexible film, and moreover, may be attached on the non-display area NDA outside the one side or the both sides of the display area DA of the display panel 110 in a tape automated bonding (TAB) type.

The source driver IC 130 may receive digital video data and a source control signal from the timing controller 160. The source driver IC 130 may convert the digital video data into analog data voltages according to the source control signal and may respectively supply the analog data voltages to the data lines. If the source driver IC 130 is manufactured as a driving chip, the source driver IC 130 may be mounted on the flexible film 140 in a chip-on film (COF) type or a chip-on plastic (COP) type.

A plurality of pads such as data pads may be provided in the non-display area NDA of the display panel 110. Lines connecting the pads to the source driver IC 130 and lines connecting the pads to lines of the circuit board 150 may be provided on the flexible film 140. The flexible film 140 may be attached on the pads by using an anisotropic conductive film, and thus, the pads may be connected to the lines of the flexible film 140.

The circuit board 150 may be attached on the flexible film 140 which is provided in plurality. A plurality of circuits implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data and a timing signal from an external system board (not shown) through a cable of the circuit board 150. The timing controller 160 may generate a gate control signal for controlling an operation timing of the gate driver 120 and a source control signal for controlling the source driver IC 130 which is provided in plurality, based on the timing signal. The timing controller 160 may supply the gate control signal to the gate driver 120 and may supply the source control signal to the plurality of source driver ICs 130.

Figure 4:
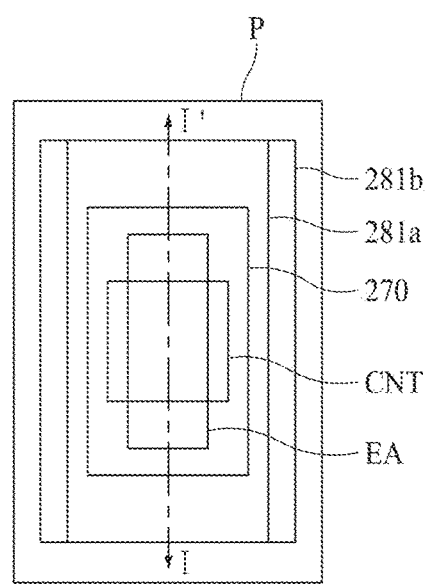
FIG. 4 is a plan view illustrating in detail an example of a pixel in a display area according to an embodiment of the present disclosure.
Figure 5:
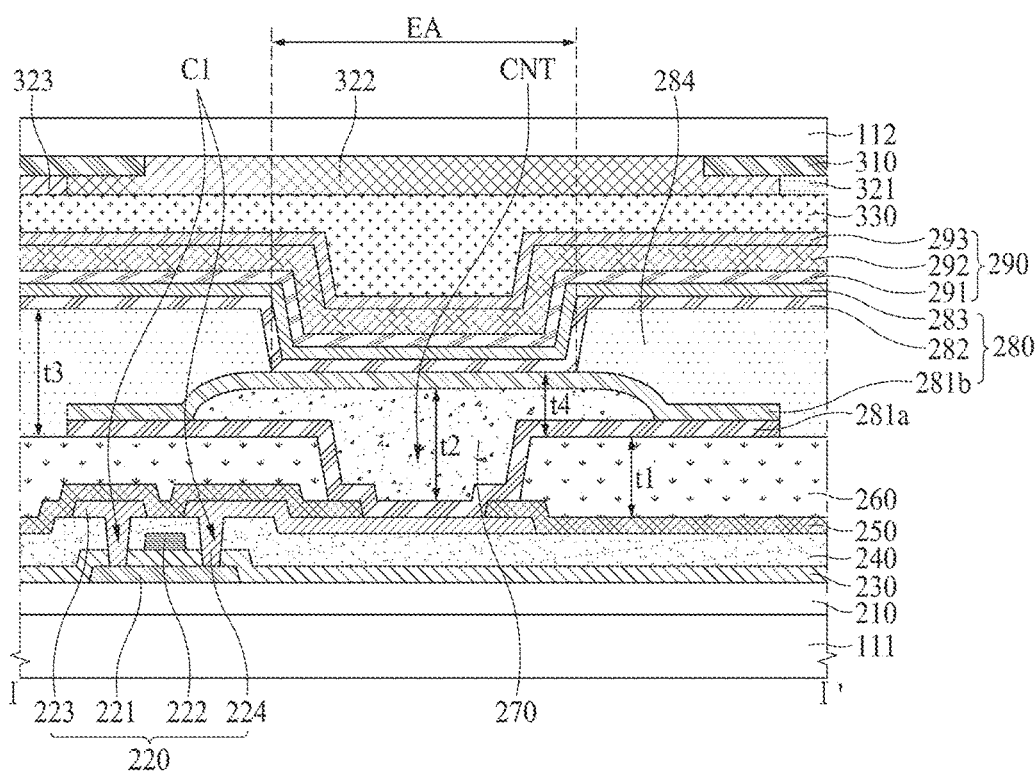
FIG. 5 is a cross-sectional view illustrating an example taken along line I-I' of FIG. 4 according to an embodiment of the present disclosure.

FIG. 4 is a plan view illustrating in detail an example of a pixel in a display area in accordance with one embodiment. FIG. 5 is a cross-sectional view illustrating an example taken along line I-I' of FIG. 4 in accordance with one embodiment.

Referring to FIGS. 4 and 5, a buffer layer 210 may be formed on one surface of the first substrate 111 facing the second substrate 112. The buffer layer 210 may be formed on the one surface of the first substrate 111, for protecting a plurality of TFTs 220 and a plurality of organic light emitting devices 280 from water which penetrates through the first substrate 111 vulnerable to penetration of water. The buffer layer 210 may include a plurality of inorganic layers which are alternately stacked. For example, the buffer layer 210 may be formed of a multilayer where one or more of silicon oxide (SiOx), silicon nitride (SiNx), and SiON are alternately stacked. The buffer layer 210 may be omitted.

The TFTs 220 may be formed on the buffer layer 210. Each of the TFTs 220 may include an active layer 221, a gate electrode 222, a source electrode 223, and a drain electrode 224. In FIG. 5, the TFTs 220 are exemplarily illustrated as being formed in a top gate type where the gate electrode 222 is disposed on the active layer 221, but is not limited thereto. That is, the TFTs 220 may be formed in a bottom gate type where the gate electrode 222 is disposed under the active layer 221 or a double gate type where the gate electrode 222 is disposed both on and under the active layer 221.

The active layer 221 may be formed on the buffer layer 210. The active layer 210 may be formed of a silicon-based semiconductor material or an oxide-based semiconductor material. A light blocking layer for blocking external light incident on the active layer 221 may be formed between the buffer layer 210 and the active layer 221.

A gate insulation layer 230 may be formed on the active layer 221. The gate insulation layer 230 may be formed of an inorganic layer, for example, silicon oxide (SiOx), silicon nitride (SiNx), or a multilayer thereof.

The gate electrode 222 and a gate line may be formed on the gate insulation layer 230. The gate electrode 222 and the gate line may each be formed of a single layer or a multilayer which includes one of molybdenum (Mo), chromium (Cr), titanium (Ti), nickel (Ni), neodymium (Nd), and copper (Cu), or an alloy thereof.

An interlayer insulation layer 240 may be formed of the gate electrode 222 and the gate line. The interlayer insulation layer 240 may be formed of an inorganic layer, for example, SiOx, SiNx, or a multilayer thereof.

The source electrode 223, the drain electrode 224, and a data line may be formed on the interlayer insulation layer 240. Each of the source electrode 223 and the drain electrode 224 may contact the active layer 221 through a contact hole C1 which passes through the gate insulation layer 230 and the interlayer insulation layer 240. The source electrode 223, the drain electrode 224, and the data line may each be formed of a single layer or a multilayer which includes one of Mo, Cr, Ti, Ni, Nd, and Cu, or an alloy thereof.

A passivation layer 250 for insulating the TFT 220 may be formed on the source electrode 223, the drain electrode 224, and the data line. The passivation layer 250 may be formed of an inorganic layer, for example, SiOx, SiNx, or a multilayer thereof.

A first planarization layer 260 for planarizing a step height caused by the TFT 220 may be formed on the passivation layer 250. The first planarization layer 260 may be formed of an organic layer such as acryl resin, epoxy resin, phenolic resin, polyamide resin, polyimide resin, and/or the like.

A contact hole CNT which passes through the passivation layer 250 and the first planarization layer 260 and exposes a portion of the drain electrode 224 of the TFT 220 may be formed in the passivation layer 250 and the first planarization layer 260. The contact hole CNT may be formed to overlap an emissive area EA as illustrated in FIG. 4. In FIG. 4, a portion of the contact hole CNT is illustrated as overlapping the emissive area EA, but is not limited thereto. In other embodiments, a whole portion of the contact hole CNT may overlap the emissive area EA.

An auxiliary electrode 281a may be formed on the first planarization layer 260. The auxiliary electrode 281a may be connected to the drain electrode 224 of the TFT 220 through the contact hole CNT. In FIG. 5, the auxiliary electrode 281a is illustrated as contacting the drain electrode 224 of the TFT 220, but may be connected to the source electrode 223 of the TFT 220. Furthermore, in FIG. 5 the auxiliary electrode 281a partially fills in a portion of the contact hole CNT. Also, as shown in FIG. 5, the auxiliary electrode 281a is directly connected to both an electrode of the light emitting device 280 and an electrode of the TFT 220.

A second planarization layer 270 may be formed on the auxiliary electrode 281a. The second planarization layer 270 may be filled into the remaining portion of the contact hole CNT, for planarizing a step height caused by the contact hole CNT. The second planarization layer 270 may be formed of an organic layer such as acryl resin, epoxy resin, phenolic resin, polyamide resin, polyimide resin, and/or the like.

The second planarization layer 270 may be formed to cover the contact hole CNT, for filling the step height of the contact hole CNT. Therefore, as illustrated in FIG. 4, the second planarization layer 270 may be formed wider than the contact hole CNT. However, an embodiment of the present disclosure is not limited thereto. In other embodiments, the second planarization layer 270 may be formed equal to or narrower than the contact hole CNT. In one embodiment, the width of the contact hole CNT is wider than the EA. Alternatively, the width of the contact hole CNT is less than the width of the EA. In one embodiment, the contact hole CNT may have varying ranges of overlap with the EA. For example, 10%-95% of the contact hole CNT may overlap the EA.

Moreover, as illustrated in FIG. 4, the second planarization layer 270 may be formed wider than the emissive area EA. In this case, the first electrode 281b, the organic light emitting layer 282, and the second electrode 283 may be formed on the second planarization layer 270 in the emissive area EA, and thus, the organic light emitting layer 282 is formed to a uniform thickness in the emissive area EA, whereby the emissive area EA outputs uniform light.

Due to a feature of a manufacturing process of the second planarization layer 270, a thickness t2 of the second planarization layer 270 may be adjusted thicker than a thickness t1 of the first planarization layer 260. Thus, a thickness of a portion (e.g., a center portion) of the second planarization layer 270 is thicker than a thickness of the first planarization layer 260. The reason that the thickness t2 of the second planarization layer 270 is adjusted thicker than the thickness t1 of the first planarization layer 260 will be described in detail with reference to FIGS. 8A and 8B.

The organic light emitting device 280 may be formed on the second planarization layer 270. The organic light emitting device 280 may include the first electrode 281b, the organic light emitting layer 282, and the second electrode 283. An area where the first electrode 281b, the organic light emitting layer 282, and the second electrode 283 are stacked may be defined as the emissive area EA. The first electrode 281b may be an anode electrode, and the second cathode electrode 283 may be a cathode electrode.

The first electrode 281b may be formed on the second planarization layer 270. As illustrated in FIG. 4, the first electrode 281b may be formed wider than the auxiliary electrode 281a, and thus, the auxiliary electrode 281a which is not covered by the second planarization layer 270 may be connected to the first electrode 281b. In FIG. 4, it is illustrated that the first electrode 281b and the auxiliary electrode 281a contact each other outside both sides of the contact hole CNT, but the present embodiment is not limited thereto. In other embodiments, the first electrode 281b and the auxiliary electrode 281a may be connected to each other outside at least one side of the contact hole CNT.

The auxiliary electrode 281a and the first electrode 281b may be formed of the same material. Alternatively, each of the auxiliary electrode 281a and the first electrode 281b may be formed of one metal layer or two or more metal layers.

Each of the auxiliary electrode 281a and the first electrode 281b may be formed of a transparent conductive material or an opaque conductive material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

For example, the first electrode 281b may be formed in a stacked structure of two or more layers including a conductive material and a transparent conductive material which are high in reflectivity like Al or Ag, and the auxiliary electrode 281a may be formed of a material which is low in resistance like Mo, a stacked structure (Mo/Ti) of Mo and Ti, Cu, or a stacked structure (Ti/Al/Ti) of Al and Ti. Also, in order to maximally widen a reflective area, the first electrode 281b may be formed of a transparent conductive material, and the auxiliary electrode 281a may be formed of a conductive material which is high in reflectivity like Al or Ag.

A bank 284 may be formed on the first planarization layer 260 to cover an edge of the first electrode 281b, for defining the emissive area EA. An area where the bank 284 is formed cannot emit light, and thus, may be defined as a non-emissive area. For example, a first bank (e.g., a left bank) is formed over a first overlapping portion (e.g., left end) of the auxiliary electrode 281a, the second planarization layer 270, and the first electrode 281b of the light-emitting device. Furthermore, a second bank (e.g., a right bank) is formed over a second overlapping portion (e.g., a right end) of the auxiliary electrode 281a, the second planarization layer 270, and the first electrode 281b of the light-emitting device. A portion of the auxiliary electrode 281a that is not covered by the first bank and second bank define a width of the emissive area EA. That is, the bank 284 may define the emissive area EA. A third thickness t3 of the bank 284 may be adjusted thicker than a distance t4 between the first planarization layer 260 and the organic light emitting layer 282. Additionally, in the embodiment shown in FIG. 5, a thickness of the banks 284 are uniform.

The second planarization layer 270 may be convexly formed. Since the second planarization layer 270 is convex in shape as shown in FIG. 5, the second planarization layer 270 has a non-uniform thickness. Also, the organic light emitting layer 282 may be formed by a process such as an evaporation deposition process which is not good in step coverage characteristic, and thus, may be thinly formed in an inclined portion of the second planarization layer 270. Therefore, the first electrode 281a or a charge generating layer of the organic light emitting layer 282 and the second electrode 283 can be short-circuited in the inclined portion of the second planarization layer 270. The step coverage may denote that a layer deposited by a certain deposition process connects without being disconnected in a portion where a step height is formed. However, in an embodiment of the present disclosure, since the bank 284 is formed to cover the inclined portion of the second planarization layer 270, the first electrode 281a or the charge generating layer of the organic light emitting layer 282 and the second electrode 283 are prevented from being short-circuited in the inclined portion of the second planarization layer 270.

The organic light emitting layer 282 may be formed on the first electrode 281b and the bank 284. The organic light emitting layer 282 may include a hole transporting layer, a light emitting layer, and an electron transporting layer. In this case, when a voltage is applied to the first electrode 281b and the second electrode 283, a hole and an electron may respectively move to the light emitting layer through the hole transporting layer and the electron transporting layer and may be combined with each other in the light emitting layer to emit light.

The organic light emitting layer 282 may be a white light emitting layer that emits white light. In this case, as illustrated in FIG. 5, the organic light emitting layer 282 may be formed to cover the first electrode 281b and the bank 284. Also, in this case, a plurality of color filters 321 to 323 may be formed to overlap the emissive area EA.

Alternatively, the organic light emitting layer 282 may include a red light emitting layer emitting red light, a green light emitting layer emitting green light, and a blue light emitting layer emitting blue light. In this case, the emissive area EA may be divided into a red emissive area emitting red light, a green emissive area emitting green light, and a blue emissive area emitting blue light, and each of the red emissive area, the green emissive area, and the blue emissive area may not include a color filter. The red light emitting layer may be formed on the first electrode 281b in the red emissive area, the green light emitting layer may be formed on the first electrode 281b in the green emissive area, and the blue light emitting layer may be formed on the first electrode 281b in the blue emissive area.

The second electrode 283 may be formed on the organic light emitting layer 282. The second electrode 283 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be formed on the second electrode 283.

An encapsulation layer 290 may be formed on the second electrode 283. The encapsulation layer 290 prevents oxygen or water from penetrating into the organic light emitting layer 282 and the second electrode 283. To this end, the encapsulation layer 290 may include at least one inorganic layer and at least one organic layer. In FIG. 5, the encapsulation layer 290 is illustrated as including a first inorganic layer 291, an organic layer 292, and a second inorganic layer 293, but is not limited thereto.

The first inorganic layer 291 may be formed on the second electrode 283 to cover the second electrode 283. The organic layer 292 may be formed on the first inorganic layer 291 to cover the first inorganic layer 291. The organic layer 292 may be formed to a sufficient thickness, for preventing particles from penetrating into the organic light emitting layer 282 and the second electrode 283 via the first inorganic layer 291. The second inorganic layer 293 may be formed on the organic layer 292 to cover the organic layer 292.

Each of the first and second inorganic layers 291 and 293 may be formed of silicon nitride, aluminum nitride, zirconium nitride, titanium nitride, hafnium nitride, tantalum nitride, silicon oxide, aluminum oxide, titanium oxide, and/or the like. The organic layer 292 may be formed of acryl resin, epoxy resin, phenolic resin, polyamide resin, polyimide resin, and/or the like.

The color filters 321 to 323 and a black matrix 310 may be formed on the substrate 112 facing the first substrate 111. A red color filter 323 may be formed in the red emissive area, a blue color filter 322 may be formed in the blue emissive area, and a green color filter 321 may be formed in the green emissive area. The black matrix (BM) 310 may be disposed between the color filters 321 to 323. If the organic light emitting layer 282 includes the red light emitting layer emitting red light, the green light emitting layer emitting green light, and the blue light emitting layer emitting blue light, the color filters 321 to 323 and the black matrix 310 may be omitted.

The encapsulation layer 290 of the first substrate 111 and the color filters 321 to 323 of the second substrate 112 may be adhered to each other by an adhesive layer 330, and thus, the first substrate 111 and the second substrate 112 may be bonded to each other. The adhesive layer 330 may be transparent adhesive resin.

As described above, in an embodiment of the present disclosure, the contact hole CNT may be formed to overlap the emissive area EA, and the second planarization layer 270 may be filled into the contact hole CNT, for planarizing the step height of the contact hole CNT. Therefore, in an embodiment of the present disclosure, the organic light emitting layer may be formed on the second planarization layer 270 to have a uniform thickness, and thus, even when the contact hole CNT is formed to overlap the emissive area EA, the emissive area EA outputs light uniformly.

Moreover, since an organic light emitting device is deteriorated with the lapse of time, it is very important to extend a lifetime of the organic light emitting device in an organic light emitting display device. If an area of an emissive area where an organic light emitting layer emits light is enlarged, a lifetime of the organic light emitting device extends. In an embodiment of the present disclosure, the contact hole CNT may be formed to overlap the emissive area EA, and thus, an area of the emissive area EA does not depend on an area of the contact hole CNT. As a result, in an embodiment of the present disclosure, an area of the emissive area EA may be designed irrespective of an area of the contact hole CNT, and thus, an area of the emissive area EA is maximized, thereby improving a lifetime of the organic light emitting layer.

Moreover, in an embodiment of the present disclosure, since an area of the emissive area EA is maximized, an area of a non-emissive area is minimized. Accordingly, if an embodiment of the present disclosure is applied to HMDs, the non-emissive area is prevented from being seen in a lattice pattern.

Figure 6:
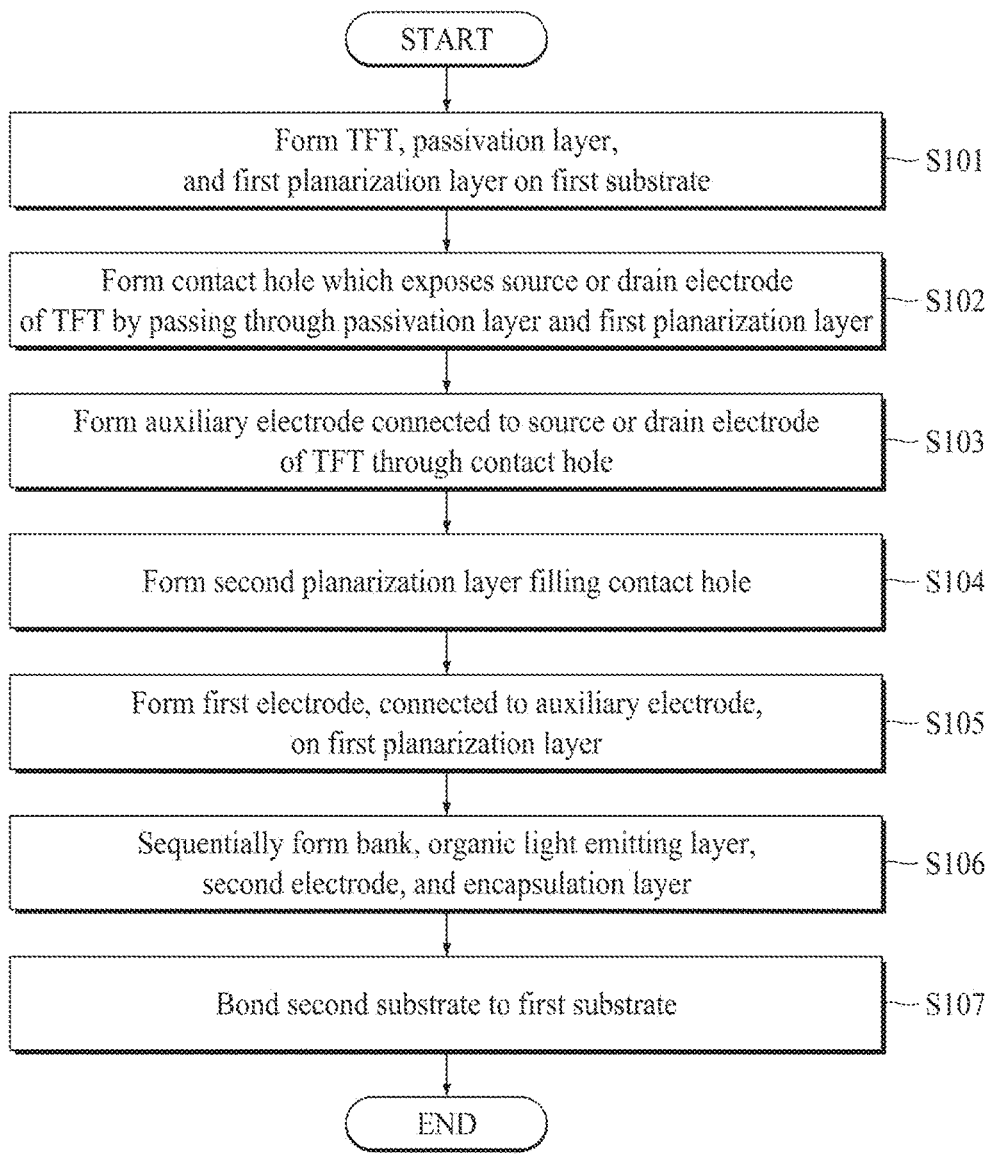
FIG. 6 is a flowchart illustrating a method of manufacturing an organic light emitting display device according to an embodiment of the present disclosure.

FIG. 6 is a flowchart illustrating a method of manufacturing an organic light emitting display device according to an embodiment of the present disclosure. FIGS. 7A to 7G are cross-sectional views taken along line I-I' for describing a method of manufacturing an organic light emitting display device according to an embodiment of the present disclosure.

The cross-sectional views illustrated in FIGS. 7A to 7G relate to the method of manufacturing the organic light emitting display device illustrated in FIG. 5, and thus, like reference numerals refer to like elements. Hereinafter, a method of manufacturing an organic light emitting display device according to an embodiment of the present disclosure will be described in detail with reference to FIGS. 6 and 7A to 7G.

Figure 7A:
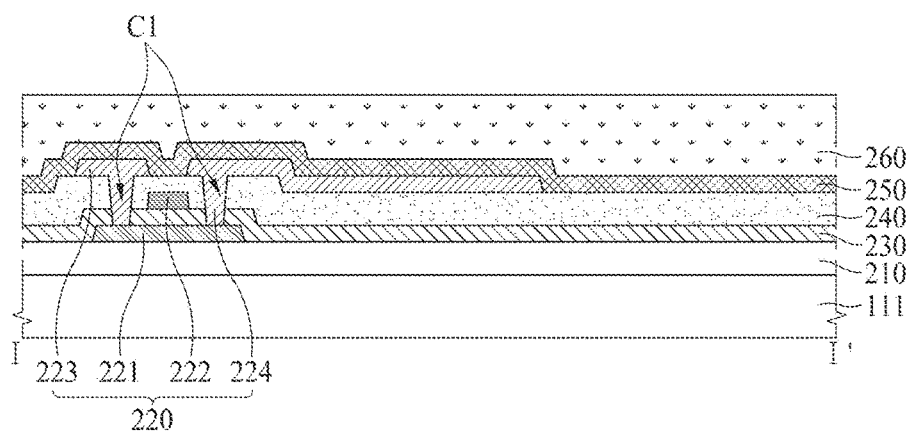
FIGS. 7A to 7G are cross-sectional views taken along line I-I' for describing a method of manufacturing an organic light emitting display device according to an embodiment of the present disclosure.

First, as illustrated in FIG. 7A, a TFT 220, a passivation layer 250, and a first planarization layer 260 may be formed on a first substrate 111.

Before forming the TFT 220, a buffer layer 210 for protecting the TFT 220 and an organic light emitting device 280 from water penetrating through the first substrate 111 may be formed on the first substrate 111. The buffer layer 210 may be formed of a plurality of inorganic layers which are alternately stacked, for protecting the TFT 220 and the organic light emitting device 280 from water which penetrates through the first substrate 111 vulnerable to penetration of water. For example, the buffer layer 210 may be formed of a multilayer where one or more of SiOx, SiNx, and SiON are alternately stacked. The buffer layer 210 may be formed by a chemical vapor deposition (CVD) process.

Subsequently, an active layer 221 included in the TFT 220 may be formed on the buffer layer 210. In detail, an active metal layer may be formed all over the buffer layer 210 by using a sputtering process, a metal organic chemical vapor deposition (MOCVD) process, and/or the like. Subsequently, the active layer 221 may be formed by patterning the active metal layer through a mask process using a photoresist pattern. The active layer 221 may be formed of a silicon-based semiconductor material or an oxide-based semiconductor material.

Subsequently, a gate insulation layer 230 may be formed on the active layer 221. The gate insulation layer 230 may be formed of an inorganic layer, for example, SiOx, SiNx, or a multilayer thereof. The gate insulation layer 230 may be formed by a CVD process.

Subsequently, a gate electrode 222 included in the TFT 220 and a gate line may be formed on the gate insulation layer 230. In detail, a first metal layer may be formed all over the gate insulation layer 230 by using a sputtering process, an MOCVD process, and/or the like. Subsequently, the gate electrode 222 and the gate line may be formed by patterning the first metal layer through a mask process using a photoresist pattern. The gate electrode 222 and the gate line may each be formed of a single layer or a multilayer which includes one of Mo, Cr, Ti, Ni, Nd, and Cu, or an alloy thereof.

Subsequently, an interlayer insulation layer 230 may be formed on the gate electrode 222. The interlayer insulation layer 230 may be formed of an inorganic layer, for example, SiOx, SiNx, or a multilayer thereof. The interlayer insulation layer 230 may be formed by a CVD process.

Subsequently, contact holes C1 which pass through the gate insulation layer 210 and the interlayer insulation layer 230 and expose the active layer 221 may be formed.

Subsequently, a source electrode 223 and a drain electrode 224 included in the TFT 220 and a data line may be formed on the interlayer insulation layer 230. In detail, a second metal layer may be formed all over the interlayer insulation layer 230 by using a sputtering process, an MOCVD process, and/or the like. Subsequently, the source electrode 223, the drain electrode 224, and the data line may be formed by patterning the second metal layer through a mask process using a photoresist pattern. The source electrode 223, the drain electrode 224, and the data line may contact the active layer 221 through the contact holes C1 which pass through the gate insulation layer 210 and the interlayer insulation layer 230 and expose the active layer 221. The source electrode 223, the drain electrode 224, and the data line may each be formed of a single layer or a multilayer which includes one of Mo, Cr, Ti, Ni, Nd, and Cu, or an alloy thereof.

Subsequently, a passivation layer 240 may be formed on the source electrode 223 and the drain electrode 224 of the TFT 220. The passivation layer 240 may be formed of an inorganic layer, for example, SiOx, SiNx, or a multilayer thereof. The passivation layer 240 may be formed by a CVD process.

Subsequently, a planarization layer 250 for planarizing a step height caused by the TFT 220 may be formed on the passivation layer 240. The passivation layer 250 may be formed of an organic layer such as acryl resin, epoxy resin, phenolic resin, polyamide resin, polyimide resin, and/or the like. (S101 of FIG. 6)

Figure 7B:
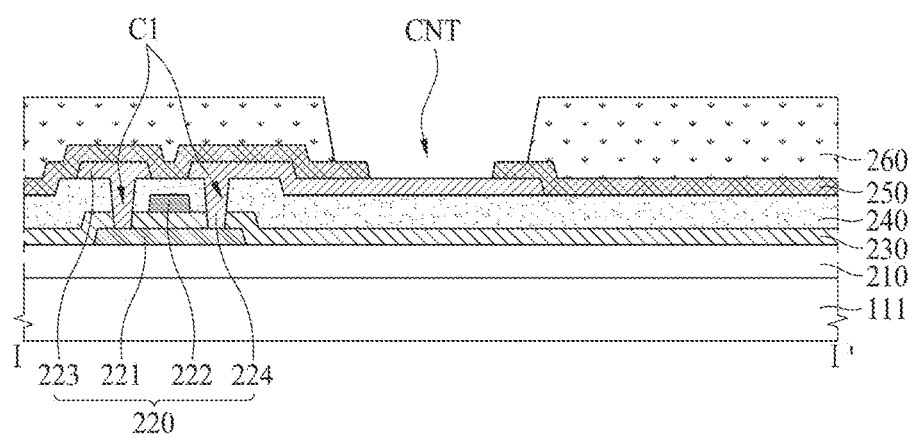

Second, as illustrated in FIG. 7B, a contact hole CNT which passes through the passivation layer 250 and the first planarization layer 260 and exposes the source electrode 223 or the drain electrode 224 of the TFT 220 may be formed. (S102 of FIG. 6)

Figure 7C:
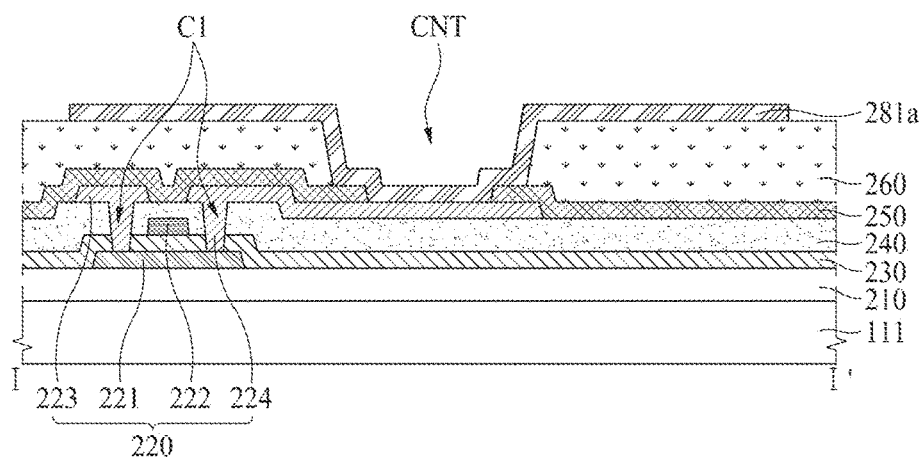

Third, as illustrated in FIG. 7C, an auxiliary electrode 281a may be formed on the first planarization layer 260. The auxiliary electrode 281a may be connected to the source electrode 223 or the drain electrode 224 of the TFT 220 through the contact hole CNT.

In detail, a third metal layer may be formed all over the first planarization layer 260 by using a sputtering process, an MOCVD process, and/or the like. Subsequently, the auxiliary electrode 281a may be formed by patterning the third metal layer through a mask process using a photoresist pattern.

The auxiliary electrode 281a may be formed of a transparent conductive material or an opaque conductive material. The transparent conductive material may be a transparent conductive material (or TCO), such as ITO or IZO, or a semi-transmissive conductive material such as Mg, Ag, or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, Pd, and Cu. (S103 of FIG. 6)

Figure 7D:
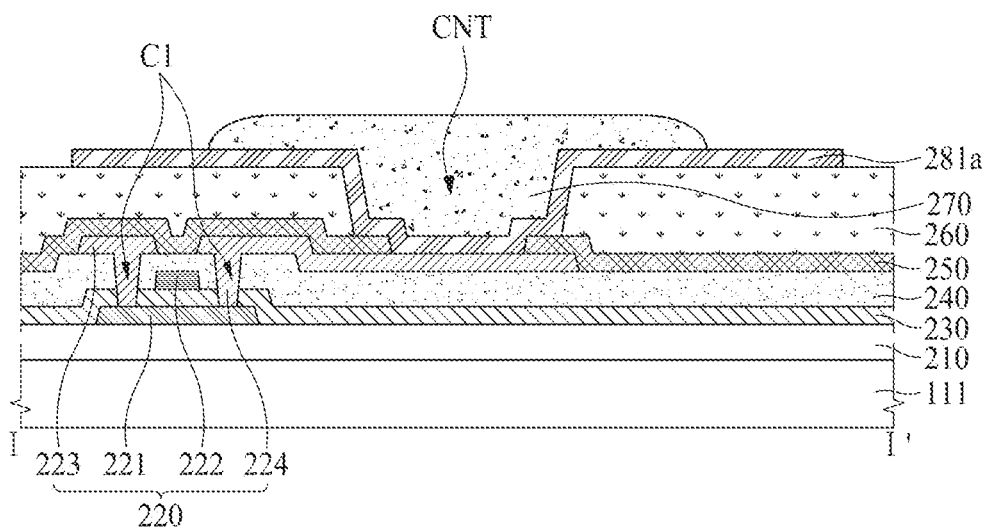

Fourth, as illustrated in FIG. 7D, a second planarization layer 270 may be formed on the auxiliary electrode 281a. The second planarization layer 270 may be filled into the contact hole CNT, for planarizing a step height caused by the contact hole CNT.

Figure 8A:
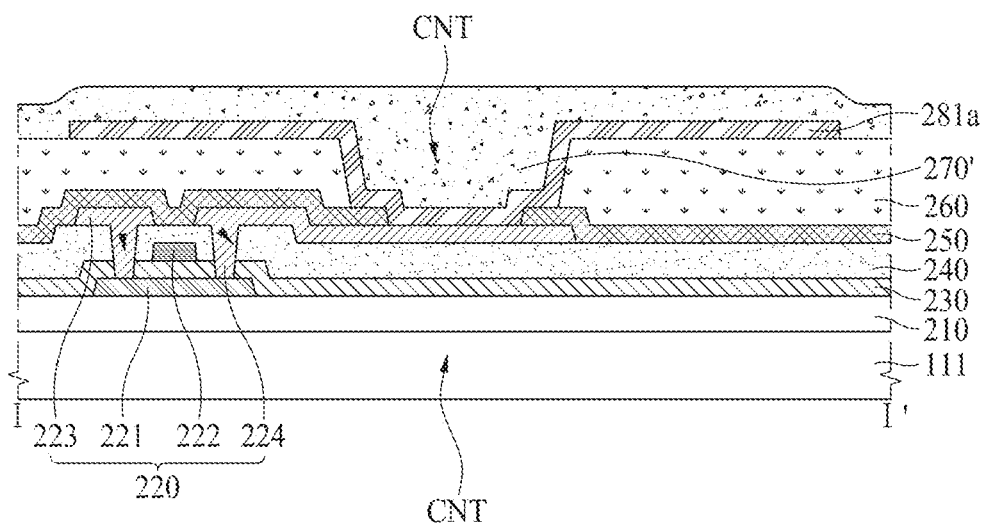
FIGS. 8A and 8B are cross-sectional views taken along line I-I' illustrating in detail operation S105 of FIG. 6 according to an embodiment of the present disclosure.

In detail, as illustrated in FIG. 8A, an organic material 270' may be coated on the first planarization layer 260 and the auxiliary electrode 281a. The organic material 270' may be acryl resin, epoxy resin, phenolic resin, polyamide resin, polyimide resin, or the like. The organic material 270' may be formed on the first planarization layer 260 and the auxiliary electrode 281a by using a slit coating process, a spin coating process, an evaporation process, and/or the like. The organic material 270' may be filled into the contact hole CNT.

Figure 8B:
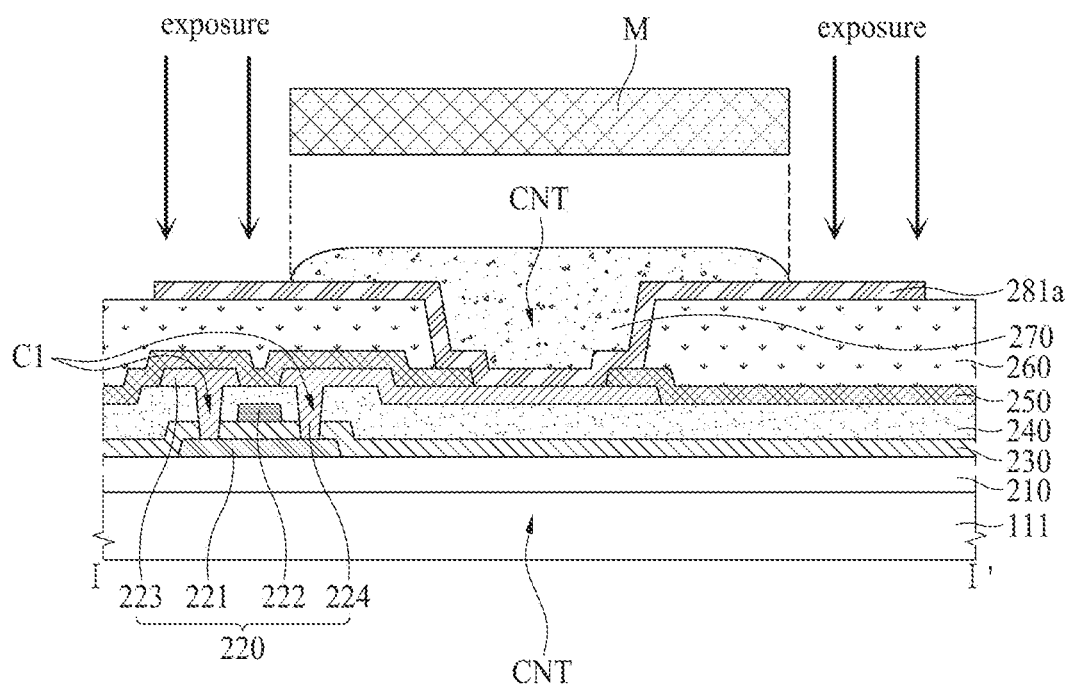

Subsequently, as illustrated in FIG. 8B, finally, a mask M may be located on the contact hole CNT, and then, a development process may be performed on the organic material 270', formed in an area where the mask M is not located, through a photolithography process. As a result, the second planarization layer 270 may be formed to cover the contact hole CNT.

As described above, as illustrated in FIGS. 8A and 8B, in a case of forming the second planarization layer 270 through a photolithography process, the second planarization layer 270 may be filled into the contact hole CNT, and moreover, may be formed to cover a portion of the auxiliary electrode 281a formed on the first planarization layer 260. Therefore, as illustrated in FIGS. 8A and 8B, in a case of forming the second planarization layer 270 through the photolithography process, a thickness t2 of the second planarization layer 270 may be adjusted thicker than a thickness t1 of the first planarization layer 260. Accordingly, the second planarization layer 270 may be formed wider than the contact hole CNT. (S104 of FIG. 6)

Figure 7E:
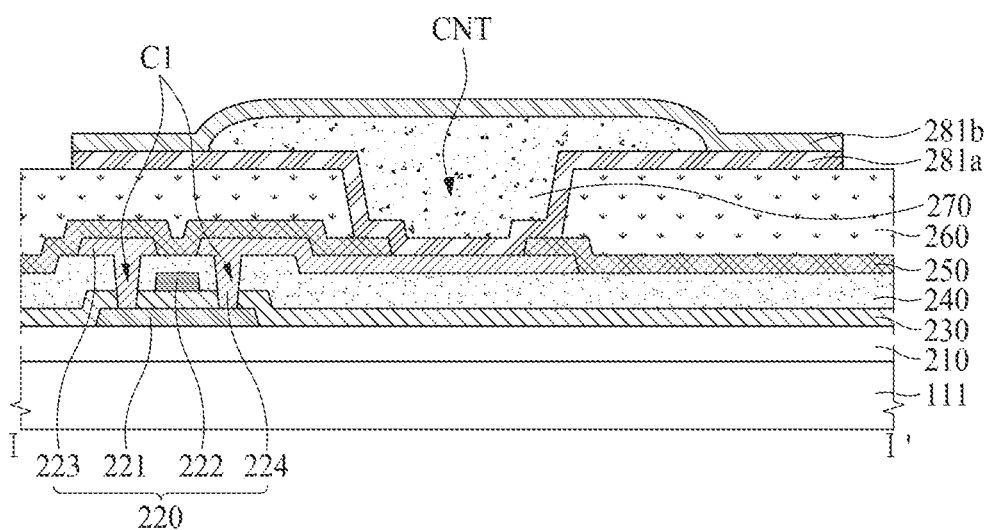

Fifth, as illustrated in FIG. 7E, a first electrode 281b may be formed on the second planarization layer 270. The first electrode 281b may be connected to the auxiliary electrode 281a which is not covered by the second planarization layer 270, on the first planarization layer 260.

In detail, a fourth metal layer may be formed all over the first and second planarization layers 260 and 270 by using a sputtering process, an MOCVD process, and/or the like. Subsequently, the first electrode 281b may be formed by patterning the fourth metal layer through a mask process using a photoresist pattern.

The first electrode 281b may be formed of a transparent conductive material or an opaque conductive material. The transparent conductive material may be a transparent conductive material (or TCO), such as ITO or IZO, or a semi-transmissive conductive material such as Mg, Ag, or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, Pd, and Cu. (S105 of FIG. 6)

Figure 7F:
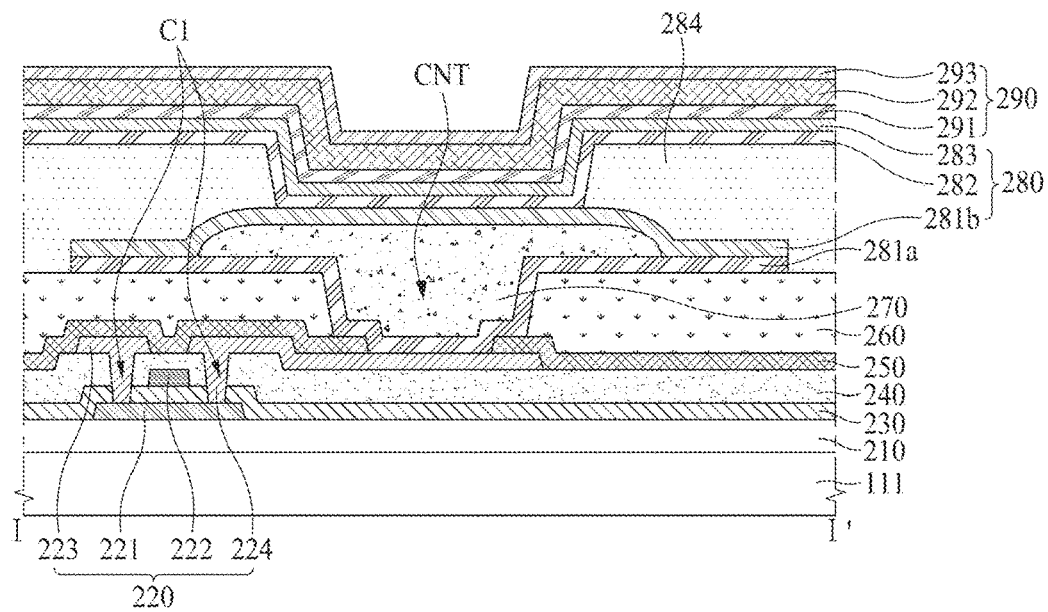

Sixth, as illustrated in FIG. 7F, a bank 284, an organic light emitting layer 282, a second electrode 283, and an encapsulation layer 290 may be sequentially formed.

First, the bank 284 may be formed to cover an edge of the first electrode 281b, for defining an emissive area EA. The bank 284 may be formed of an organic layer such as acryl resin, epoxy resin, phenolic resin, polyamide resin, polyimide resin, and/or the like.

Subsequently, an organic light emitting layer 282 may be formed on the first electrode 281b and the bank 284. The organic light emitting layer 282 may be formed through a deposition process or a solution process. In a case of forming the organic light emitting layer 282 through the deposition process, the organic light emitting layer 282 may be formed through an evaporation process.

In a case where the organic light emitting layer 262 is formed in a plurality of the emissive areas EA in common, the organic light emitting layer 262 may be formed as a white light emitting layer that emits white light. If the organic light emitting layer 262 is the white light emitting layer, the organic light emitting layer 262 may be formed in a tandem structure of two or more stacks. Each of the stacks may include a hole transporting layer, at least one light emitting layer, and an electron transporting layer. Also, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be formed by doping a dopant on an organic material having an ability to transport holes.

Subsequently, a second electrode 283 may be formed on the organic light emitting layer 282. The second electrode 283 may be a common layer which is formed in the plurality of emissive areas EA in common. The second electrode 283 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be formed on the second electrode 283.

Subsequently, an encapsulation layer 290 may be formed on the second electrode 283. The encapsulation layer 290 prevents oxygen or water from penetrating into the organic light emitting layer 282 and the second electrode 283. To this end, the encapsulation layer 290 may include at least one inorganic layer and at least one organic layer.

For example, the encapsulation layer 290 may include a first inorganic layer 291, an organic layer 292, and a second inorganic layer 293. In this case, the first inorganic layer 291 may be formed to cover the second electrode 283. The organic layer 292 may be formed to cover the first inorganic layer 291. The organic layer 292 may be formed to a sufficient thickness, for preventing particles from penetrating into the organic light emitting layer 282 and the second electrode 283 via the first inorganic layer 291. The second inorganic layer 293 may be formed to cover the organic layer 292.

Each of the first and second inorganic layers 291 and 293 may be formed of silicon nitride, aluminum nitride, zirconium nitride, titanium nitride, hafnium nitride, tantalum nitride, silicon oxide, aluminum oxide, titanium oxide, and/or the like. The organic layer 292 may be formed of acryl resin, epoxy resin, phenolic resin, polyamide resin, polyimide resin, and/or the like. (S106 of FIG. 6)

Figure 7G:
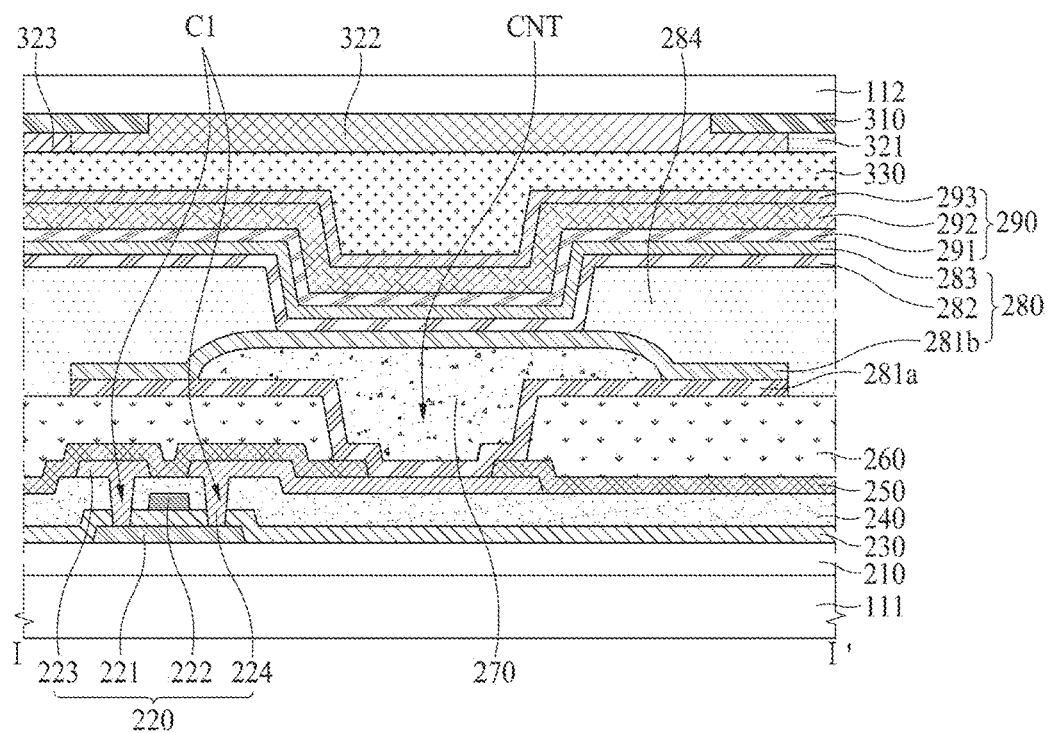

Seventh, as illustrated in FIG. 7G, the first substrate 111 may be bonded to the second substrate 112 by attaching the encapsulation layer 290 of the first substrate 111 on color filters 321 to 323 of the second substrate 112 by using an adhesive layer 330. The adhesive layer 330 may be transparent adhesive resin. (S107 of FIG. 6)

Figure 9:
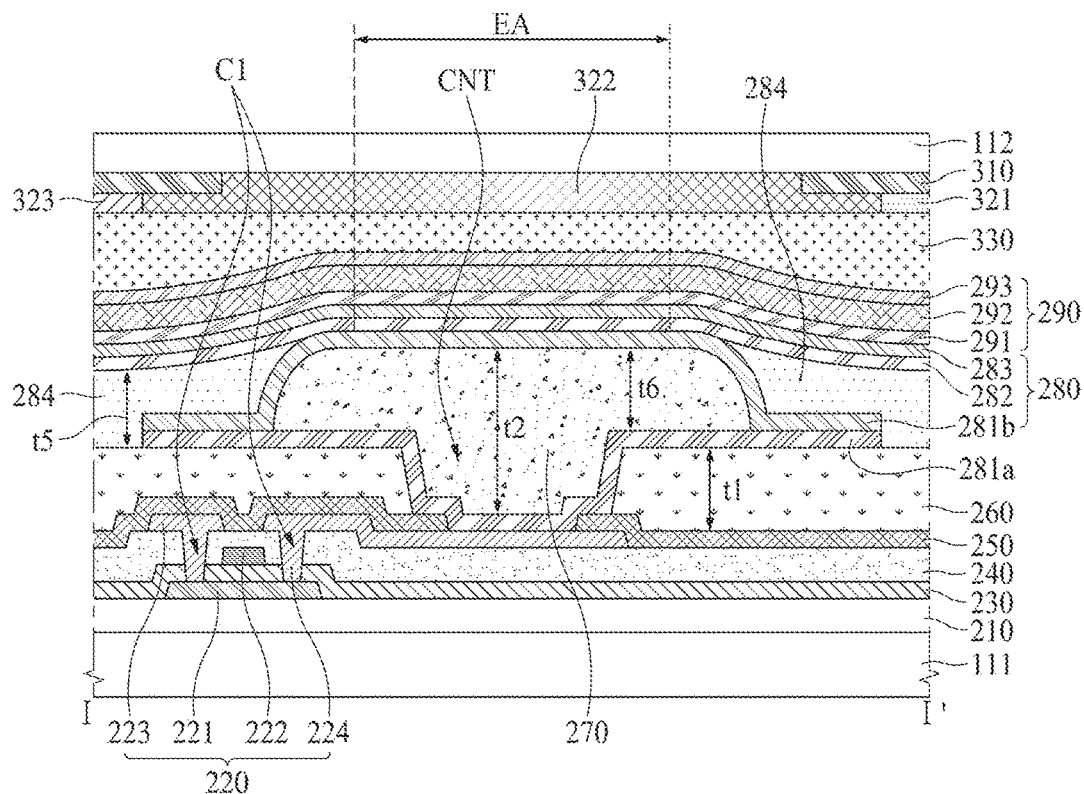
FIG. 9 is a cross-sectional view illustrating another example taken along line I-I' of FIG. 4 according to an embodiment of the present disclosure.

FIG. 9 is a cross-sectional view illustrating another example taken along line I-I' of FIG. 4.

Except that the second planarization layer 270 is formed to cover a step height caused by the second planarization layer 270 between the bank 284 and the first electrode 281b, FIG. 9 is substantially the same as described above with reference to FIG. 5. Thus, in FIG. 9, detailed descriptions on elements other than the bank 284 are not repeated.

The bank 284 may be formed on the first planarization layer 260 to cover an edge of the first electrode 281b, for defining the emissive area EA. An area where the bank 284 is formed cannot emit light, and thus, may be defined as a non-emissive area. For example, a first bank (e.g., a left bank) is formed over a first overlapping portion (e.g., left end) of the auxiliary electrode 281a, the second planarization layer 270, and the first electrode 281b of the light-emitting device. Furthermore, a second bank (e.g., a right bank) is formed over a second overlapping portion (e.g., a right end) of the auxiliary electrode 281a, the second planarization layer 270, and the first electrode 281b of the light-emitting device. A portion of the auxiliary electrode 281a that is not covered by the first bank and second bank define a width of the emissive area EA. That is, the bank 284 may define the emissive area EA. A thickness t5 of the bank 284 may be adjusted thinner than a thickness t6 of the second planarization layer 270. As shown in FIG. 9, the thickness of the bank 284 is non-uniform. Furthermore, as shown in FIG. 9, the second planarization layer 270 and the first electrode 281b of the light emitting device 280 included in the first overlapping portion and the second planarization layer 270 and the first electrode 281b of the light-emitting device included in the second overlapping portion are inclined at an angle corresponding to the non-uniform thicknesses of the first bank and the second bank.

The second planarization layer 270 may be convexly formed. Since the second planarization layer 270 is convex in shape as shown in FIG. 9, the second planarization layer 270 has a non-uniform thickness. Also, the organic light emitting layer 282 may be formed by a process such as an evaporation deposition process which is not good in step coverage characteristic, and thus, may be thinly formed in an inclined portion of the second planarization layer 270. Therefore, the first electrode 281a or a charge generating layer of the organic light emitting layer 282 and the second electrode 283 can be short-circuited in the inclined portion of the second planarization layer 270. The step coverage may denote that a layer deposited by a certain deposition process connects without being disconnected in a portion where a step height is formed. However, in an embodiment of the present disclosure, since the bank 284 is formed to cover the inclined portion of the second planarization layer 270, the first electrode 281a or the charge generating layer of the organic light emitting layer 282 and the second electrode 283 are prevented from being short-circuited in the inclined portion of the second planarization layer 270.

Figure 10:
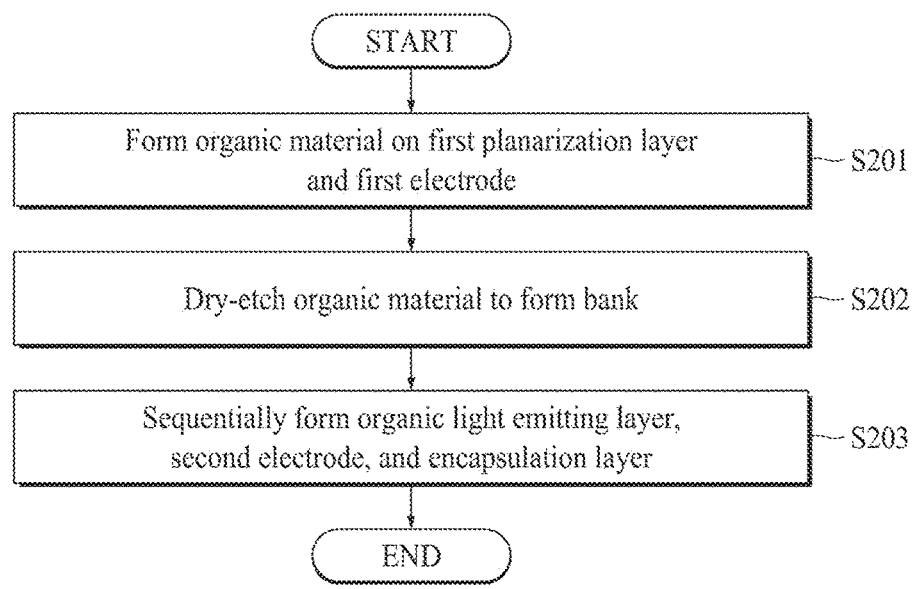
FIG. 10 is a flowchart illustrating a method of manufacturing an organic light emitting display device according to another embodiment of the present disclosure.
Figure 11A:
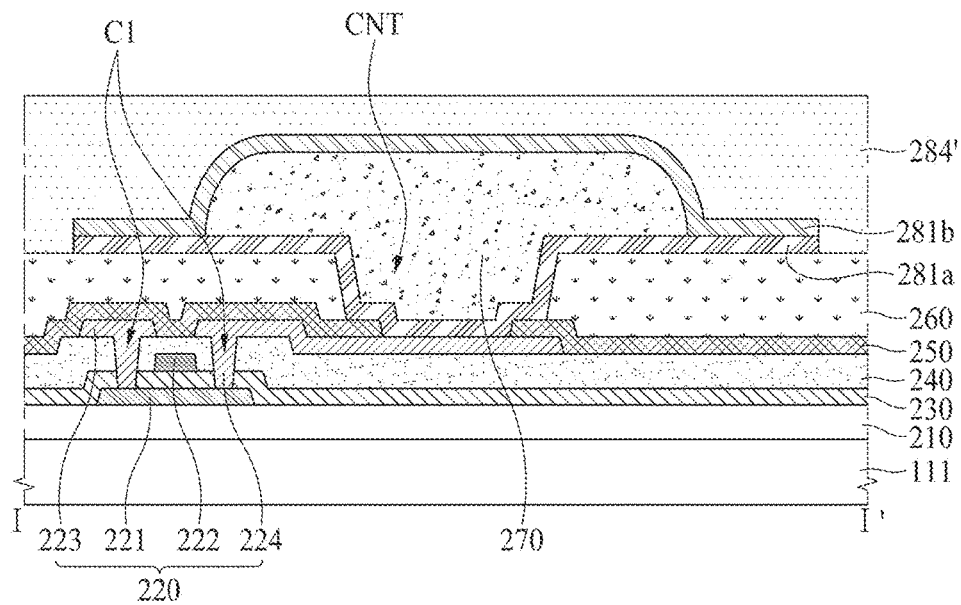
FIGS. 11A to 11C are cross-sectional views taken along line I-I' for describing a method of manufacturing an organic light emitting display device according to another embodiment of the present disclosure.
Figure 11B:
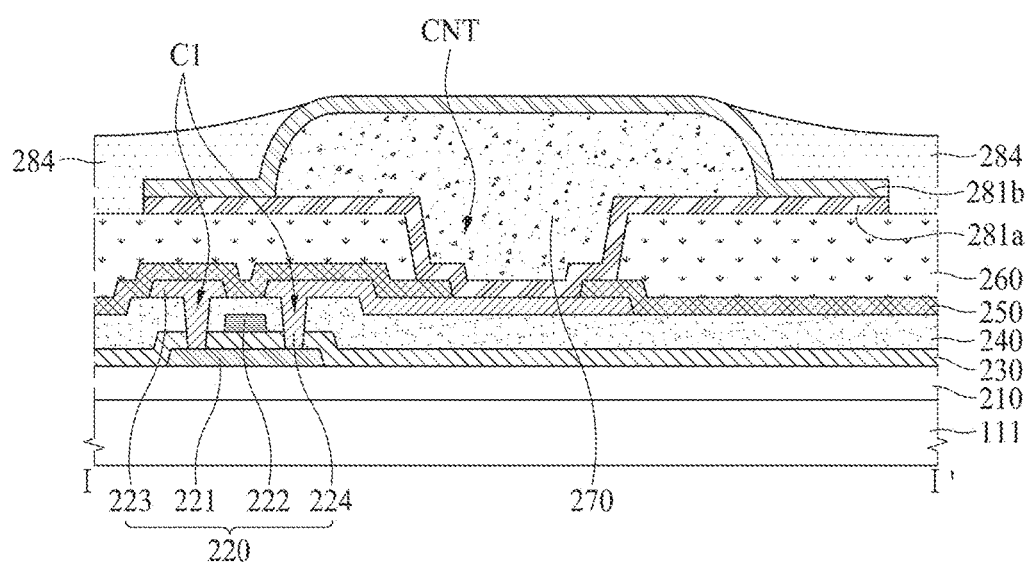
Figure 11C:
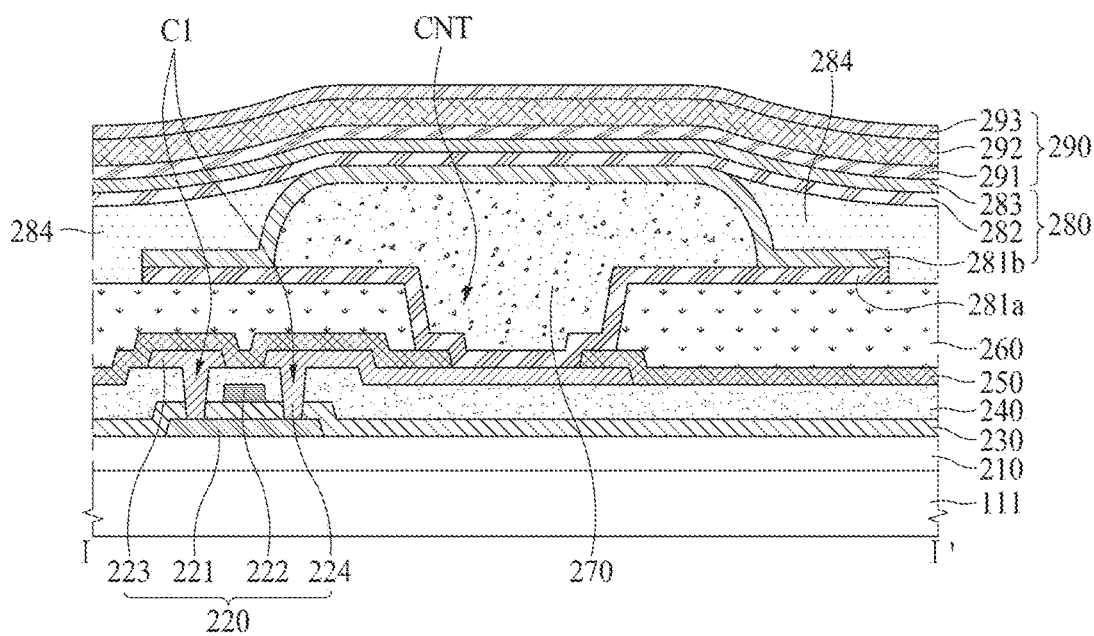

FIG. 10 is a flowchart illustrating a method of manufacturing an organic light emitting display device according to another embodiment of the present disclosure. FIGS. 11A to 11C are cross-sectional views taken along line I-I' for describing a method of manufacturing an organic light emitting display device according to another embodiment of the present disclosure.

Except for an operation of forming a bank 284, an organic light emitting layer 282, a second electrode 283, and an encapsulation layer 290 in operation S106 of FIG. 6, the method of manufacturing the organic light emitting display device according to another embodiment of the present disclosure illustrated in FIG. 10 is substantially the same as described above with reference to FIGS. 6 and 7A to 7G. Hereinafter, therefore, an operation of forming the bank 284, the organic light emitting layer 282, the second electrode 283, and the encapsulation layer 290 will be described in detail with reference to FIGS. 10 and 11A to 11C. The cross-sectional views illustrated in FIGS. 11A to 11C relate to the method of manufacturing the organic light emitting display device illustrated in FIG. 9, and thus, like reference numerals refer to like elements.

Hereinafter, operations S201 to S203 will be described in detail with reference to FIGS. 10 and 11A to 11C.

First, as illustrated in FIG. 11A, an organic material 284' may be coated on a first planarization layer 260 and a first electrode 281b.

The organic material 284' may be acryl resin, epoxy resin, phenolic resin, polyamide resin, polyimide resin, or the like. The organic material 284' may be formed on the first planarization layer 260 and the first electrode 281b by using a slit coating process, a spin coating process, an evaporation process, and/or the like. The organic material 284' may be formed to fill a second planarization layer 270. (S201 of FIG. 10)

Subsequently, as illustrated in FIG. 11B, a bank 284 may be formed by dry-etching the organic material 284' without using a mask. Therefore, the present disclosure may decrease the manufacture cost because the mask is not used. Also, a dry-etching material may be selected as a material that etches the organic material 284' but cannot etch the first electrode 281b.

In a case of forming the bank 284 through a dry-etching process, the bank 284 may be filled into a second planarization layer 270. Particularly, the bank 284 filled into the second planarization layer 270 may be concavely formed through dry etching. Therefore, in a case of forming the bank 284 through the dry-etching process, a thickness t5 of the bank 284 may be adjusted thinner than a thickness t6 of the second planarization layer 270. (S202 of FIG. 10)

Subsequently, as illustrated in FIG. 11C, an organic light emitting layer 282, a second electrode 283, and an encapsulation layer 290 may be sequentially formed.

Subsequently, the organic light emitting layer 282 may be formed on the first electrode 281b and the bank 284. The organic light emitting layer 282 may be formed through a deposition process or a solution process. In a case of forming the organic light emitting layer 282 through the deposition process, the organic light emitting layer 282 may be formed through an evaporation process.

In a case where the organic light emitting layer 262 is formed in a plurality of the emissive areas EA in common, the organic light emitting layer 262 may be formed as a white light emitting layer that emits white light. If the organic light emitting layer 262 is the white light emitting layer, the organic light emitting layer 262 may be formed in a tandem structure of two or more stacks. Each of the stacks may include a hole transporting layer, at least one light emitting layer, and an electron transporting layer. Also, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer which is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generating layer may be formed by doping a dopant on an organic material having an ability to transport holes.

Subsequently, the second electrode 283 may be formed on the organic light emitting layer 282. The second electrode 283 may be a common layer which is formed in the plurality of emissive areas EA in common. The second electrode 283 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be formed on the second electrode 283.

Subsequently, the encapsulation layer 290 may be formed on the second electrode 283. The encapsulation layer 290 prevents oxygen or water from penetrating into the organic light emitting layer 282 and the second electrode 283. To this end, the encapsulation layer 290 may include at least one inorganic layer and at least one organic layer.

For example, the encapsulation layer 290 may include a first inorganic layer 291, an organic layer 292, and a second inorganic layer 293. In this case, the first inorganic layer 291 may be formed to cover the second electrode 283. The organic layer 292 may be formed to cover the first inorganic layer 291. The organic layer 292 may be formed to a sufficient thickness, for preventing particles from penetrating into the organic light emitting layer 282 and the second electrode 283 via the first inorganic layer 291. The second inorganic layer 293 may be formed to cover the organic layer 292.

Each of the first and second inorganic layers 291 and 293 may be formed of silicon nitride, aluminum nitride, zirconium nitride, titanium nitride, hafnium nitride, tantalum nitride, silicon oxide, aluminum oxide, titanium oxide, and/or the like. The organic layer 292 may be formed of acryl resin, epoxy resin, phenolic resin, polyamide resin, polyimide resin, and/or the like. (S203 of FIG. 10)

Figure 12:
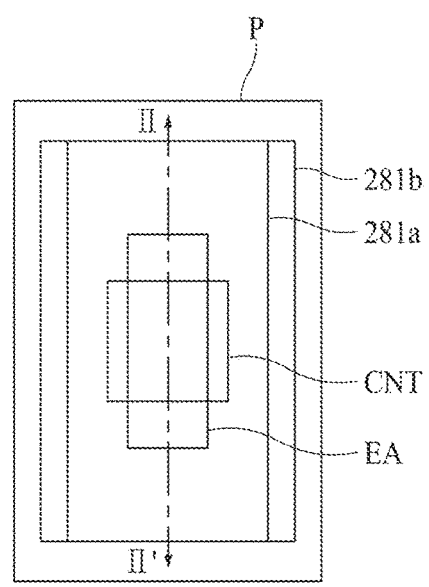
FIG. 12 is a plan view illustrating in detail another example of a pixel in a display area according to an embodiment of the present disclosure.
Figure 13:
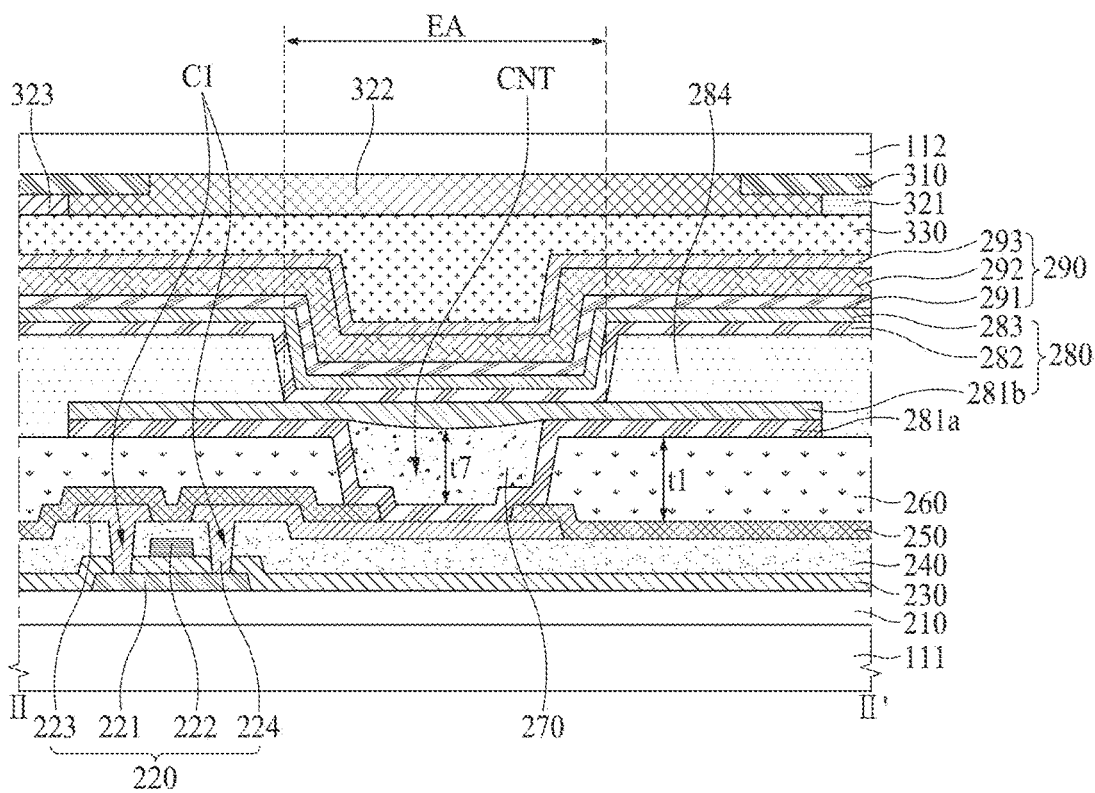
FIG. 13 is a cross-sectional view illustrating an example taken along line II-II" of FIG. 12.

FIG. 12 is a plan view illustrating in detail another example of a pixel in a display area. FIG. 13 is a cross-sectional view illustrating an example taken along line II-II' of FIG. 12.

Except for a second planarization layer 270, an auxiliary electrode 281a, and a first electrode 281b, a pixel P of an organic light emitting display device illustrated in FIGS. 12 and 13 is substantially the same as described above with reference to FIGS. 4 and 5. Thus, in FIGS. 12 and 13, detailed descriptions on elements other than the second planarization layer 270, the auxiliary electrode 281a, and the first electrode 281b are not repeated.

An auxiliary electrode 281a may be formed on a first planarization layer 260. The auxiliary electrode 281a may be connected to a drain electrode 224 of a TFT 220 through a contact hole CNT. In FIG. 13, the auxiliary electrode 281a is illustrated as contacting the drain electrode 224 of the TFT 220, but may be connected to a source electrode 223 of the TFT 220.

A second planarization layer 270 may be formed on the auxiliary electrode 281a. The second planarization layer 270 may be filled into the contact hole CNT, for planarizing a step height caused by the contact hole CNT. The second planarization layer 270 is filled into the contact hole CNT such that a thickness of the second planarization layer 270 is less than a thickness of the contact hole CNT and the thickness of the second planarization layer 270 is less than a thickness of the first planarization layer 260. The second planarization layer 270 may be formed of an organic layer such as acryl resin, epoxy resin, phenolic resin, polyamide resin, polyimide resin, and/or the like.

The second planarization layer 270 may be formed to fill the contact hole CNT, for filling the step height of the contact hole CNT. Therefore, in FIG. 13, it is illustrated that the second planarization layer 270 is substantially the same as the contact hole CNT, but an embodiment of the present disclosure is not limited thereto. In other embodiments, the second planarization layer 270 may be formed thinner than a thickness of the contact hole CNT.

Due to a feature of a manufacturing process of the second planarization layer 270, a thickness t7 of the second planarization layer 270 may be adjusted to be smaller than a thickness t1 of the first planarization layer 260. The reason that the thickness t7 of the second planarization layer 270 is adjusted smaller than the thickness t1 of the first planarization layer 260 will be described in detail with reference to FIGS. 15A and 15B.

The first electrode 281b may be formed on the second planarization layer 270. As illustrated in FIG. 12, the first electrode 281b may be formed wider than the auxiliary electrode 281a. Also, as illustrated in FIG. 12, each of the auxiliary electrode 281a and the first electrode 281b may be formed wider than the second planarization layer 270. Since the second planarization layer 270 is formed to fill only the contact hole CNT, the auxiliary electrode 281a may be connected to the first electrode 281b, on the first planarization layer 260. In FIG. 13, it is illustrated that the first electrode 281b and the auxiliary electrode 281a contact each other outside both sides of the contact hole CNT, but the present embodiment is not limited thereto. In other embodiments, the first electrode 281b and the auxiliary electrode 281a may be connected to each other outside at least one side of the contact hole CNT.

The auxiliary electrode 281a and the first electrode 281b may be formed of the same material. Alternatively, each of the auxiliary electrode 281a and the first electrode 281b may be formed of one metal layer or two or more metal layers.

Each of the auxiliary electrode 281a and the first electrode 281b may be formed of a transparent conductive material or an opaque conductive material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

For example, the first electrode 281b may be formed in a stacked structure of two or more layers including a conductive material and a transparent conductive material which are high in reflectivity like Al or Ag, and the auxiliary electrode 281a may be formed of a material which is low in resistance like Mo, a stacked structure (Mo/Ti) of Mo and Ti, Cu, or a stacked structure (Ti/Al/Ti) of Al and Ti. Also, in order to maximally widen a reflective area, the first electrode 281b may be formed of a transparent conductive material, and the auxiliary electrode 281a may be formed of a conductive material which is high in reflectivity like Al or Ag.

Figure 14:
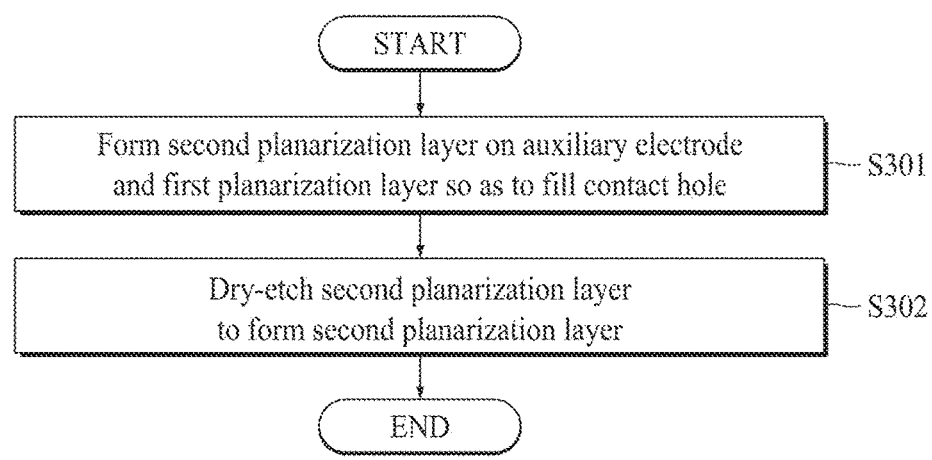
FIG. 14 is a flowchart illustrating a method of manufacturing an organic light emitting display device according to another embodiment of the present disclosure.
Figure 15A:
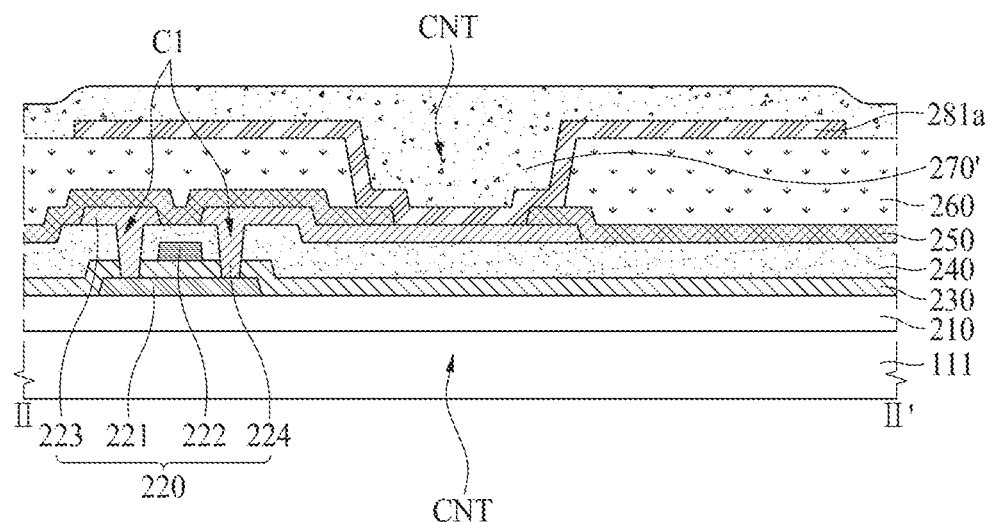
FIGS. 15A and 15B are cross-sectional views taken along line II-II" for describing a method of manufacturing an organic light emitting display device according to another embodiment of the present disclosure.
Figure 15B:
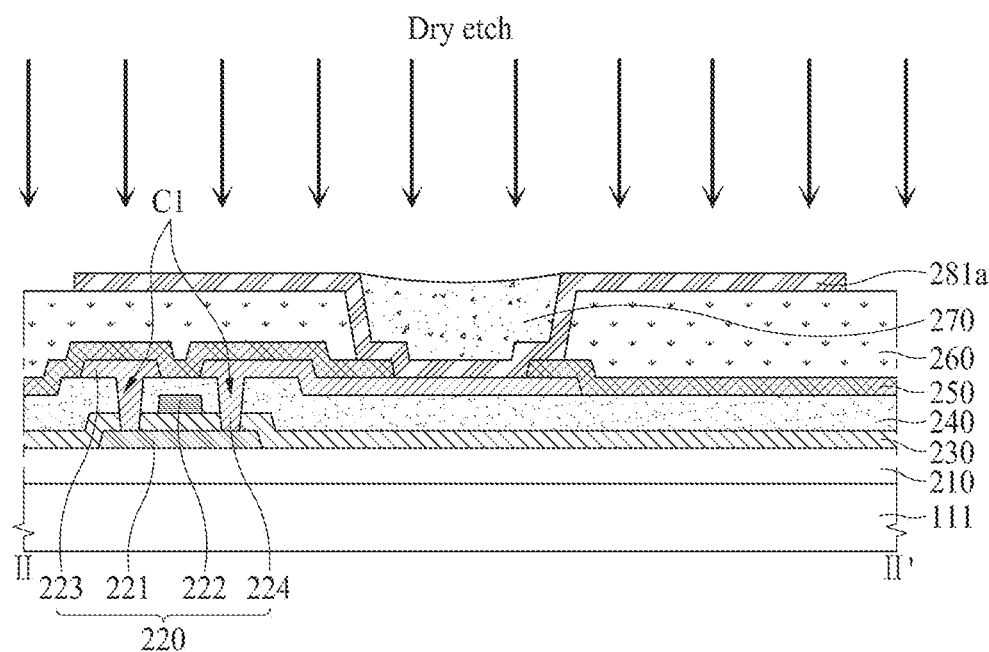

FIG. 14 is a flowchart illustrating a method of manufacturing an organic light emitting display device according to another embodiment of the present disclosure. FIGS. 15A and 15B are cross-sectional views taken along line for describing a method of manufacturing an organic light emitting display device according to another embodiment of the present disclosure.

Except for an operation of forming a second planarization layer 270 in operation S104 of FIG. 6, the method of manufacturing the organic light emitting display device according to another embodiment of the present disclosure illustrated in FIG. 14 is substantially the same as described above with reference to FIGS. 6 and 7A to 7G. Hereinafter, therefore, an operation of forming the second planarization layer 270 will be described in detail with reference to FIGS. 14, 15A and 15B. The cross-sectional views illustrated in FIGS. 15A and 15B relate to the method of manufacturing the organic light emitting display device illustrated in FIG. 13, and thus, like reference numerals refer to like elements.

Hereinafter, operations S301 and S302 will be described in detail with reference to FIGS. 14, 15A and 15B.

First, as illustrated in FIG. 15A, an organic material 270' may be coated on a first planarization layer 260 and an auxiliary electrode 281a. The organic material 270' may be acryl resin, epoxy resin, phenolic resin, polyamide resin, polyimide resin, or the like. The organic material 270' may be formed on the first planarization layer 260 and the auxiliary electrode 281a by using a slit coating process, a spin coating process, an evaporation process, and/or the like. The organic material 270' may be filled into the contact hole CNT.

Subsequently, as illustrated in FIG. 15B, a second planarization layer 270 may be formed by dry-etching the organic material 270' without using a mask. Therefore, the present disclosure may decrease the manufacture cost because the mask is not used. Also, a dry-etching material may be selected as a material that etches the organic material 270' but cannot etch the auxiliary electrode 281a.

As described above, in a case of forming the second planarization layer 270 through a dry-etching process, the second planarization layer 270 may be filled into only the contact hole CNT. Particularly, the second planarization layer 270 filled into the contact hole CNT may be concavely formed through dry etching in comparison with the first planarization layer 260. Therefore, in a case of forming the second planarization layer 270 through the dry-etching process, a thickness t7 of the second planarization layer 270 may be adjusted to be smaller than a thickness t1 of the first planarization layer 260. Accordingly, the second planarization layer 270 may be substantially the same as the contact hole CNT, but may be formed shorter than a height of the contact hole CNT.

Figure 16:
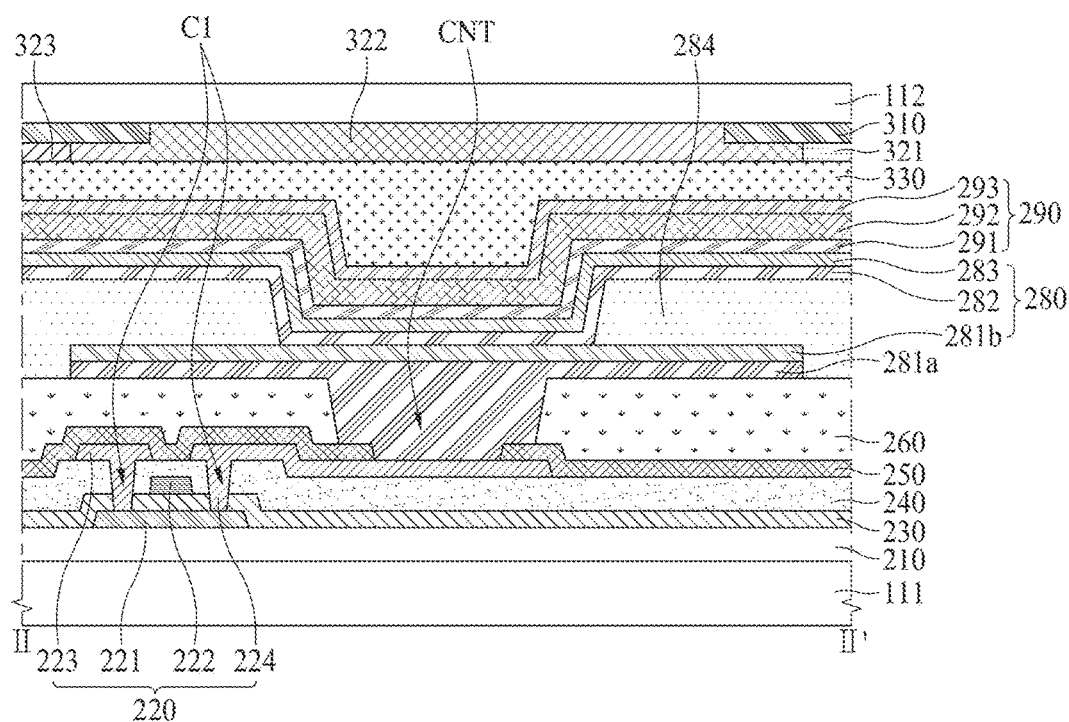
FIG. 16 is a cross-sectional view illustrating another example taken along line II-II" of FIG. 12.

FIG. 16 is a cross-sectional view illustrating another example taken along line II-II" of FIG. 12.

Except that an auxiliary electrode 281a instead of a second planarization layer 270 is formed to fill a contact hole CNT, FIG. 16 is substantially the same as described above with reference to FIG. 5. Therefore, in FIG. 16, the second planarization layer 270 may be omitted. Thus, in FIG. 16, detailed descriptions on elements other than the auxiliary electrode 281a are not repeated.

An auxiliary electrode 281a may be formed on a first planarization layer 260. The auxiliary electrode 281a may be connected to a drain electrode 224 of a TFT 220 through the contact hole CNT. In FIG. 5, the auxiliary electrode 281a is illustrated as contacting the drain electrode 224 of the TFT 220, but may be connected to a source electrode 223 of the TFT 220.

The auxiliary electrode 281a may be filled into the contact hole CNT, for planarizaing a step height caused by the contact hole CNT. That is, the auxiliary electrode 281a may be formed to completely fill the contact hole CNT (e.g., cover the contact hole CNT), for filling the step height of the contact hole CNT. Therefore, as illustrated in FIG. 16, the auxiliary electrode 281a may be formed wider than the contact hole CNT. However, an embodiment of the present disclosure is not limited thereto. In other embodiments, the auxiliary electrode 281a may be formed equal to or narrower than the contact hole CNT.

Moreover, the auxiliary electrode 281a may be formed wider than an emissive area EA. In this case, a first electrode 281b, an organic light emitting layer 282, and a second electrode 283 may be formed on the auxiliary electrode 281a in the emissive area EA, and thus, the organic light emitting layer 282 is formed to a uniform thickness in the emissive area EA, whereby the emissive area EA outputs uniform light.

The auxiliary electrode 281a may be formed of a transparent conductive material or an opaque conductive material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

As described above, in an embodiment of the present disclosure, the contact hole CNT may be formed to overlap the emissive area EA, and the auxiliary electrode 281a may be filled into the contact hole CNT, for planarizing the step height of the contact hole CNT. Therefore, in an embodiment of the present disclosure, the organic light emitting layer 282 may be formed on the auxiliary electrode 281a to have a uniform thickness, and thus, even when the contact hole CNT is formed to overlap the emissive area EA, the emissive area EA outputs light uniformly.

Moreover, since an organic light emitting device is deteriorated with the lapse of time, it is very important to extend a lifetime of the organic light emitting device in an organic light emitting display device. If an area of an emissive area where an organic light emitting layer emits light is enlarged, a lifetime of the organic light emitting device extends. In an embodiment of the present disclosure, the contact hole CNT may be formed to overlap the emissive area EA, and thus, an area of the emissive area EA does not depend on an area of the contact hole CNT. As a result, in an embodiment of the present disclosure, an area of the emissive area EA may be designed irrespective of an area of the contact hole CNT, and thus, an area of the emissive area EA is maximized, thereby improving a lifetime of the organic light emitting layer.

Moreover, in an embodiment of the present disclosure, since an area of the emissive area EA is maximized, an area of a non-emissive area is minimized. Accordingly, if an embodiment of the present disclosure is applied to HMDs, the non-emissive area is prevented from being seen in a lattice pattern.

Figure 17:
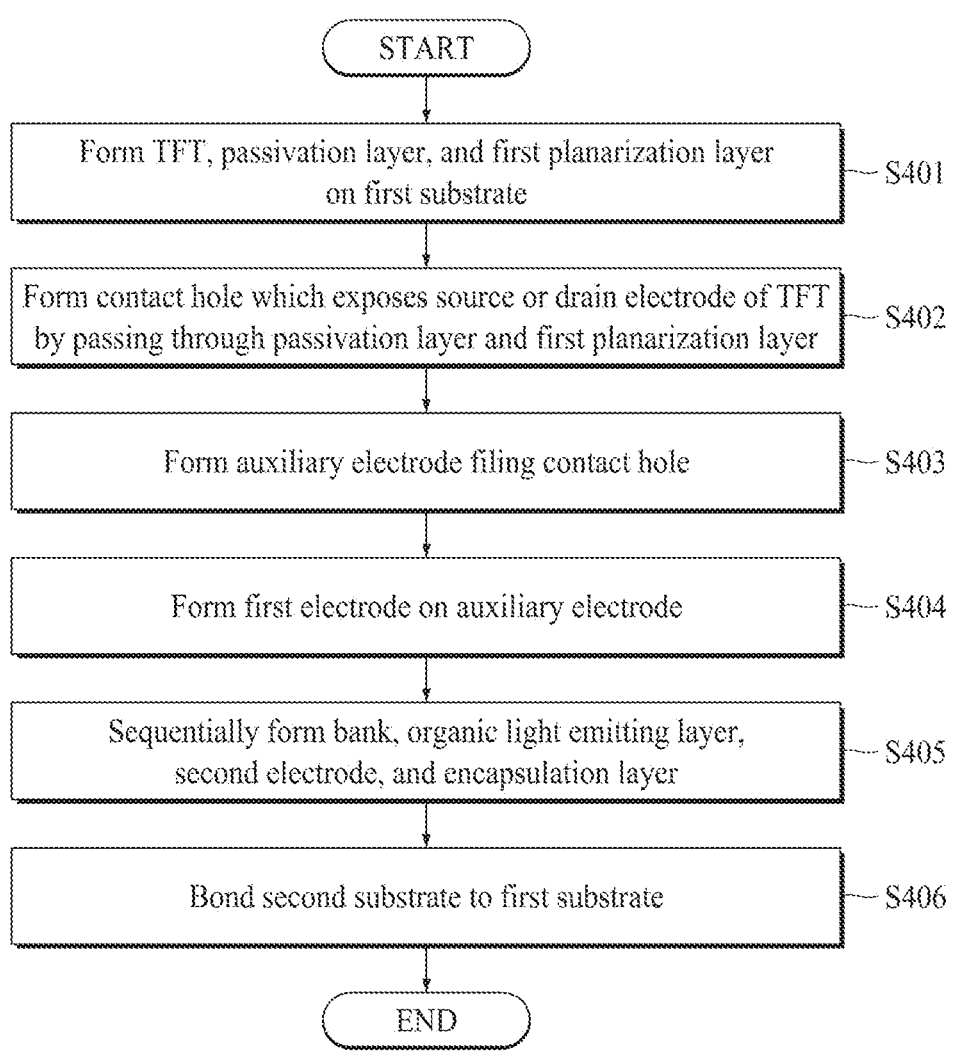
FIG. 17 is a flowchart illustrating a method of manufacturing an organic light emitting display device according to another embodiment of the present disclosure.
Figure 18A:
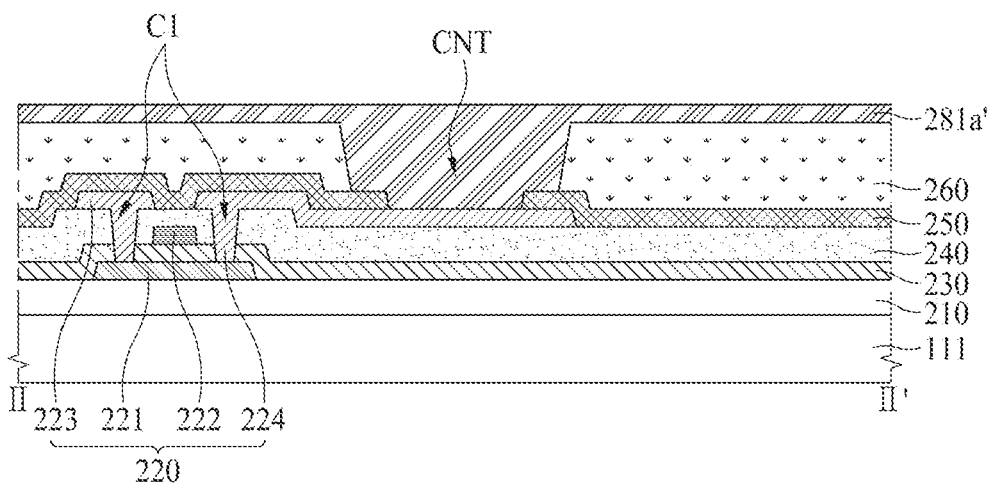
FIGS. 18A to 18C are cross-sectional views taken along line II-II" for describing a method of manufacturing an organic light emitting display device according to another embodiment of the present invention.
Figure 18B:
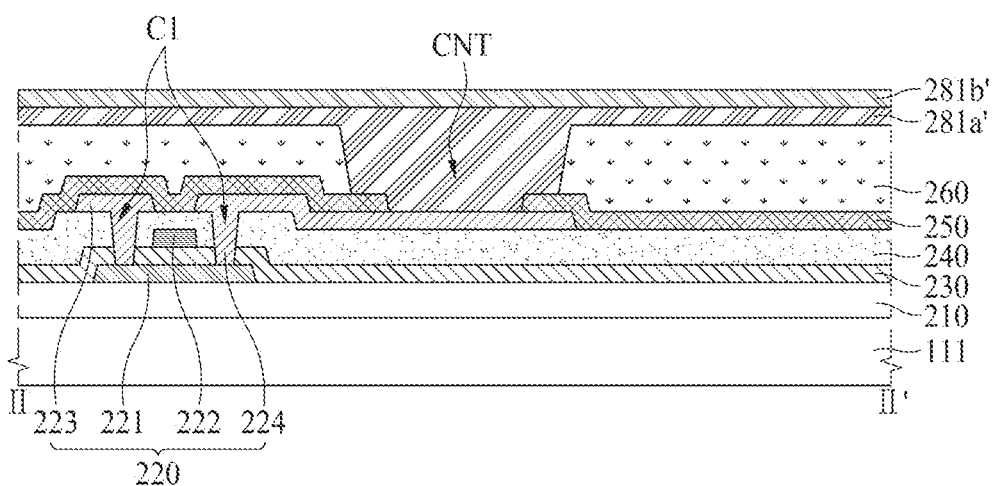
Figure 18C:
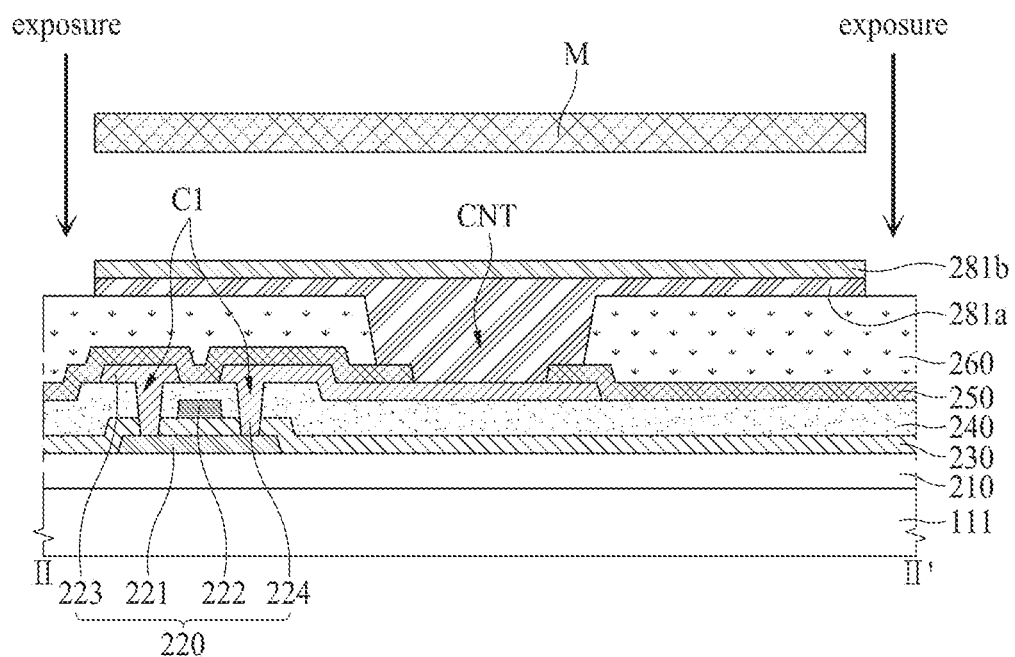

FIG. 17 is a flowchart illustrating a method of manufacturing an organic light emitting display device according to another embodiment of the present disclosure. FIGS. 18A to 18C are cross-sectional views taken along line for describing a method of manufacturing an organic light emitting display device according to another embodiment of the present invention.

Operations S401, S402, S405, and S406 of the method of manufacturing the organic light emitting display device according to another embodiment of the present invention illustrated in FIG. 17 are substantially the same as operations S101, S102, S106, and S107 of FIG. 6. Thus, detailed descriptions on operations S401, S402, S405, and S406 of the method of manufacturing the organic light emitting display device according to another embodiment of the present disclosure illustrated in FIG. 17 are not repeated. The cross-sectional views illustrated in FIGS. 18A to 18C relate to the method of manufacturing the organic light emitting display device illustrated in FIG. 16, and thus, like reference numerals refer to like elements.

Hereinafter, operations S403 to S404 will be described in detail with reference to FIGS. 17 and 18A to 18C.

First, as illustrated in FIG. 18A, a third metal layer 281a' filling a contact hole CNT may be formed all over a first planarization layer 260. In order to fill the contact hole CNT, the third metal layer 281a' may be formed by coating and curing a conductive layer which is a liquid state.

Subsequently, as illustrated in FIG. 18B, a fourth metal layer 281b' may be formed all over the third metal layer 281a'. The fourth metal layer 281b' may be formed through a sputtering process, an MOCVD process, and/or the like.

Subsequently, an auxiliary electrode 281a and a first electrode 281b may be formed by simultaneously patterning the third metal layer 281a' and the fourth metal layer 281b' through a mask process using a photoresist pattern.

Each of the auxiliary electrode 281a and the first electrode 281b may be formed of a transparent conductive material or an opaque conductive material. The transparent conductive material may be a transparent conductive material (or transparent conductive oxide (TCO)), such as indium tin oxide (ITO) or indium zinc oxide (IZO), or a semi-transmissive conductive material such as magnesium (Mg), silver (Ag), or an alloy of Mg and Ag. The opaque conductive material may be Al, Ag, Mo, a stacked structure (Mo/Ti) of Mo and Ti, Cu, a stacked structure of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

For example, the first electrode 281b may be formed in a stacked structure of two or more layers including a conductive material and a transparent conductive material which are high in reflectivity like Al or Ag, and the auxiliary electrode 281a may be formed of a material which is low in resistance like Mo, a stacked structure (Mo/Ti) of Mo and Ti, Cu, or a stacked structure (Ti/Al/Ti) of Al and Ti. Also, in order to maximally widen a reflective area, the first electrode 281b may be formed of a transparent conductive material, and the auxiliary electrode 281a may be formed of a conductive material which is high in reflectivity like Al or Ag. (S403 and S404 of FIG. 17)

Figure 19:
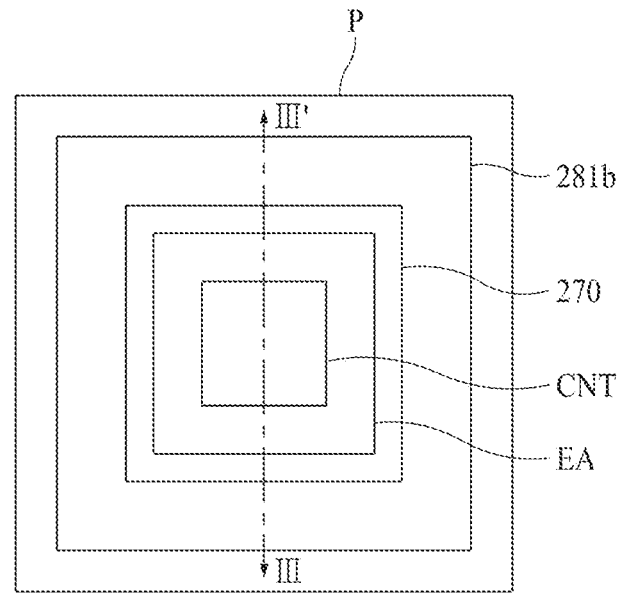
FIG. 19 is a plan view illustrating in detail another example of a pixel in a display area according to one embodiment of the present disclosure.

FIG. 19 is a plan view illustrating in detail another example of a pixel in a display area.

Except that a pixel P in a display area illustrated in FIG. 19 is provided in a square shape, the pixel P of FIG. 19 is substantially the same as described above with reference to FIG. 4. Thus, in FIG. 19, detailed descriptions on elements of the pixel P are omitted.

According to an embodiment of the present disclosure, the pixel P may be provided in a square shape as illustrated in FIG. 19, and in this case, an area of an emissive area EA may be enlarged in the other direction (a lateral direction) as well as one direction (a vertical direction) in comparison with a case where each pixel is provided in a rectangular shape as in FIG. 4, whereby the emissive area EA may be further widened. Accordingly, in an embodiment of the present disclosure, a lifetime of an organic light emitting layer is improved, and moreover, an area of a non-emissive area is minimized.

Moreover, according to an embodiment of the present disclosure, the pixel P may be provided in a square shape as illustrated in FIG. 19, and in this case, the first electrode 281b may be connected to the auxiliary electrode 281a outside all sides of the contact hole CNT. Accordingly, even when a process error occurs in forming the auxiliary electrode 281a, the first electrode 281b, and the contact hole CNT, the first electrode 281b may be connected to the auxiliary electrode 281a outside at least one side of the contact hole CNT.

A cross-sectional structure taken along line III-III" of FIG. 19 may be substantially the same as a cross-sectional view taken along line I-I' of FIG. 5 or a cross-sectional view taken along line I-I' of FIG. 9.

Figure 20:
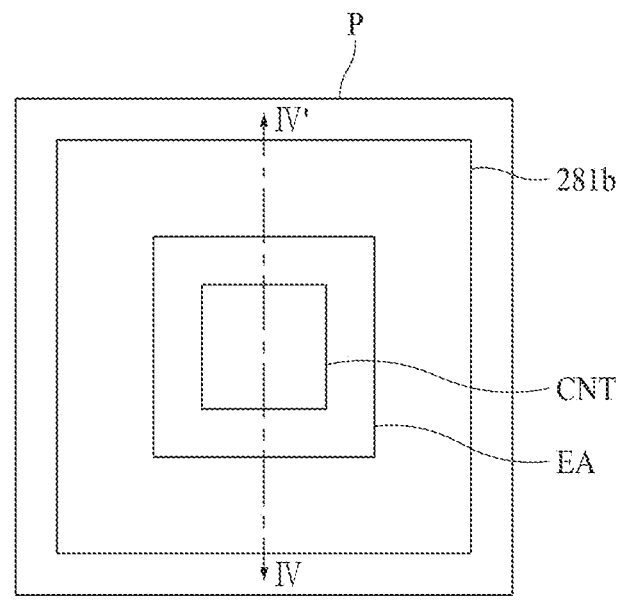
FIG. 20 is a plan view illustrating in detail another example of a pixel in a display area according to one embodiment of the present disclosure.

FIG. 20 is a plan view illustrating in detail another example of a pixel in a display area.

Except that a pixel P in a display area illustrated in FIG. 20 is provided in a square shape, the pixel P of FIG. 12 is substantially the same as described above with reference to FIG. 12. Thus, in FIG. 20, detailed descriptions on elements of the pixel P are omitted.

According to an embodiment of the present disclosure, the pixel P may be provided in a square shape as illustrated in FIG. 20, and in this case, an area of an emissive area EA may be enlarged in the other direction (a lateral direction) as well as one direction (a vertical direction) in comparison with a case where each pixel is provided in a rectangular shape as in FIG. 12, whereby the emissive area EA may be further widened. Accordingly, in an embodiment of the present invention, a lifetime of an organic light emitting layer is improved, and moreover, an area of a non-emissive area is minimized.

Moreover, according to an embodiment of the present invention, the pixel P may be provided in a square shape as illustrated in FIG. 20, and in this case, the first electrode 281b may be connected to the auxiliary electrode 281a outside all sides of the contact hole CNT. Accordingly, even when a process error occurs in forming the auxiliary electrode 281a, the first electrode 281b, and the contact hole CNT, the first electrode 281b may be connected to the auxiliary electrode 281a outside at least one side of the contact hole CNT.

A cross-sectional structure taken along line IV-IV' of FIG. 20 may be substantially the same as a cross-sectional view taken along line II-II' of FIG. 13 or a cross-sectional view taken along line II-II' of FIG. 16.

Figure 21A:
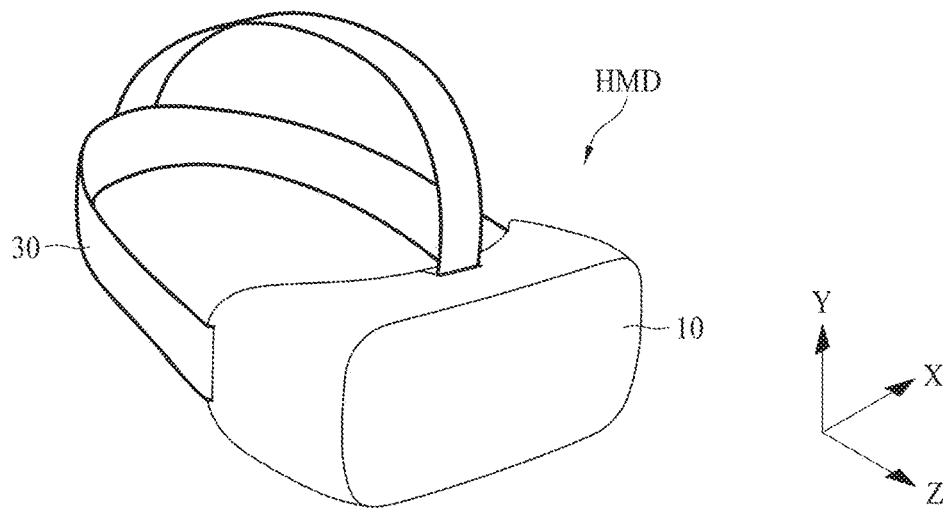
FIGS. 21A and 21B are exemplary diagrams illustrating an HMD according to an embodiment of the present disclosure.
Figure 21B:
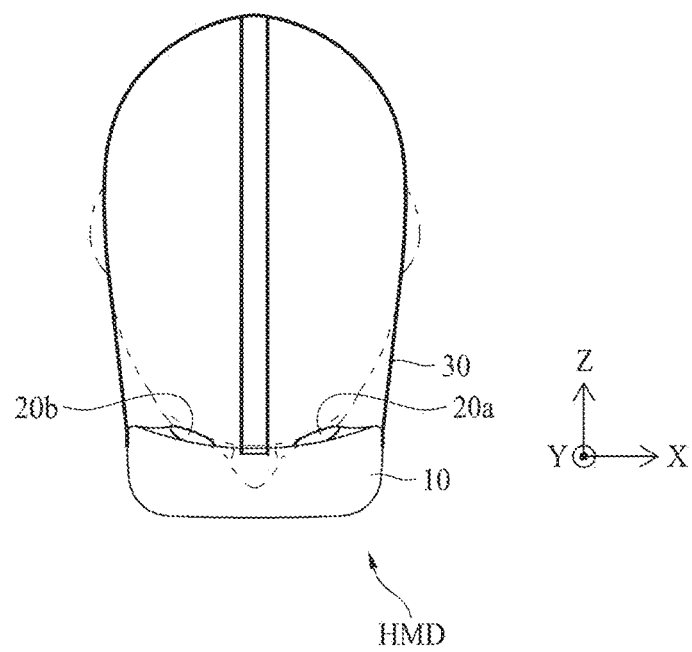

FIGS. 21A and 21B are exemplary diagrams illustrating an HMD according to an embodiment of the present disclosure.

Referring to FIGS. 21A and 21B, the HMD according to an embodiment of the present disclosure may include a display accommodating case 10, a left-eye lens 20a, a right-eye lens 20b, and a head-mountable band 30.

The display accommodating case 10 may accommodate a display device and may supply an image displayed by the display device to the left-eye lens 20a and the right-eye lens 20b. The display device may be the organic light emitting display device according to an embodiment of the present invention. The organic light emitting display device according to an embodiment of the present disclosure has been described in detail with reference to FIGS. 2 to 20.

The display accommodating case 10 may be designed to supply the same image to the left-eye lens 20a and the right-eye lens 20b. Alternatively, the display accommodating case 10 may be designed so that a left-eye image is displayed on the left-eye lens 20a and a right-eye image is displayed on the right-eye lens 20b.

Figure 22:
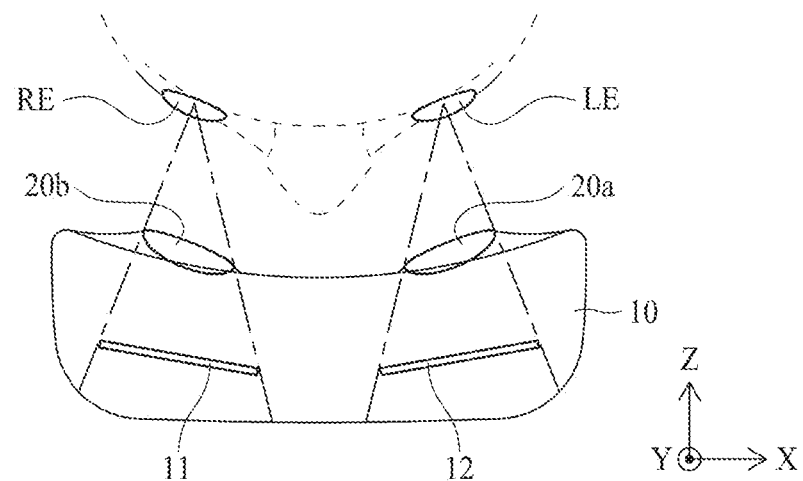
FIG. 22 is an exemplary diagram illustrating an example of a display accommodating case of FIGS. 21A and 21B according to one embodiment of the present disclosure.

As illustrated in FIG. 22, a left-eye organic light emitting display device 11 disposed in front of the left-eye lens 20a and a right-eye organic light emitting display device 12 disposed in front of the right-eye lens 20b may be accommodated into the display accommodating case 110. FIG. 22 illustrates a cross-sectional view when the display accommodating case 10 is seen from above. The left-eye organic light emitting display device 11 may display the left-eye image, and the right-eye organic light emitting display device 12 may display the right-eye image. The left-eye image displayed by the left-eye organic light emitting display device 11 may be seen to a left eye LE of a user through the left-eye lens 20a, and the right-eye image displayed by the right-eye organic light emitting display device 12 may be seen to a right eye RE of the user through the right-eye lens 20b.

Moreover, in FIG. 22, a magnifying lens may be further disposed between the left-eye lens 20a and the left-eye organic light emitting display device 11 and between the right-eye lens 20b and the right-eye organic light emitting display device 12. In this case, due to the magnifying lens, an image displayed on the left-eye organic light emitting display device 11 and an image displayed on the right-eye organic light emitting display device 12 may be enlarged and may be seen to a user.

Figure 23:
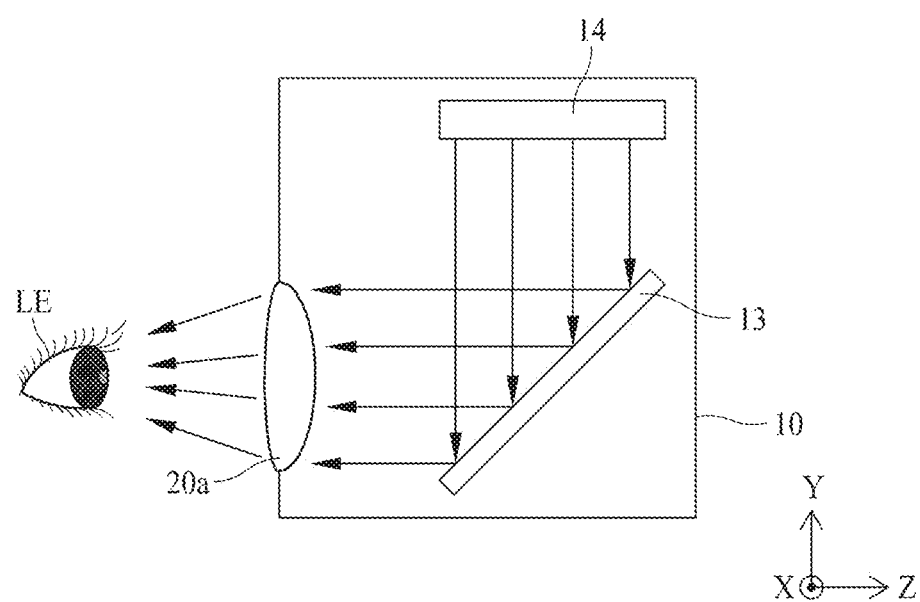
FIG. 23 is an exemplary diagram illustrating another example of a display accommodating case of FIGS. 21A and 21B according to one embodiment of the present disclosure.

As illustrated in FIG. 23, a mirror reflector 13 disposed in front of the left-eye lens 20a and the right-eye lens 20b and an organic light emitting display device 14 disposed on the mirror reflector 13 may be accommodated into the display accommodating case 10. FIG. 12 illustrates a cross-sectional view when the display accommodating case 10 is seen from side. The organic light emitting display device 14 may display an image in a direction toward the mirror reflector 13, and the mirror reflector 13 may totally reflect the image displayed by the organic light emitting display device 14 toward the left-eye lens 20a and the right-eye lens 20b. Therefore, the image displayed by the organic light emitting display device 14 may be supplied to the left-eye lens 20a and the right-eye lens 20b. In FIG. 23, for convenience of description, only the left-eye lens 20a and the left eye LE of the user are illustrated. As illustrated in FIG. 23, in a case of using the mirror reflector 13, the display accommodating case 10 may be thinly provided.

Moreover, in FIG. 22, a magnifying lens may be further disposed between the left-eye lens 20a and the mirror reflector 13 and between the right-eye lens 20b and the mirror reflector 13. In this case, due to the magnifying lens, an image displayed on the left-eye organic light emitting display device 11 and an image displayed on the right-eye organic light emitting display device 12 may be enlarged and may be seen to a user.

The head-mountable band 30 may be fixed to the display accommodating case 10. The head-mountable band 30 is exemplarily illustrated as being provided to surround a top and both sides of the user, but is not limited thereto. The head-mountable band 30 may fix the head-mounted display to the head of the user and may be implemented as a glasses type or a helmet type.

Figure 24:
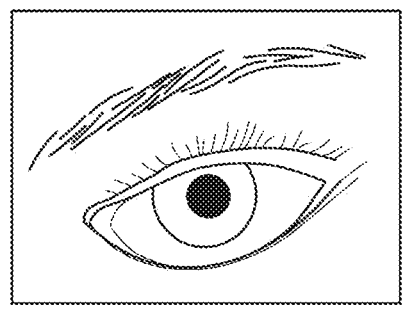
FIG. 24 is an exemplary diagram illustrating a lattice pattern of an image displayed by an HMD according to an embodiment of the present disclosure.

In the related art head-mounted display, an image displayed by an organic light emitting display device is seen in just front of eyes of a user, and for this reason, as illustrated in FIG. 1, non-emissive areas are seen in a lattice pattern. However, in an embodiment of the present disclosure, the contact hole CNT may be formed to overlap the emissive area EA, and the second planarization layer 270 may be filled into the contact hole CNT, for planarizing the step height of the contact hole CNT. Therefore, in an embodiment of the present disclosure, the organic light emitting layer may be formed on the second planarization layer 270 to have a uniform thickness, and thus, even when the contact hole CNT is formed to overlap the emissive area EA, the emissive area EA outputs light uniformly. Accordingly, in an embodiment of the present disclosure, since an area of the emissive area EA is maximized, an area of a non-emissive area is minimized. Accordingly, if an embodiment of the present disclosure is applied to HMDs, the non-emissive area is prevented from being seen in a lattice pattern as in FIG. 24.

As described above, according to the embodiments of the present disclosure, the contact hole may be formed to overlap the emissive area, and the second planarization layer may be filled into the contact hole so as to planarize the step height of the contact hole. Accordingly, according to the embodiments of the present invention, the organic light emitting layer may be formed on the second planarization layer to have a uniform thickness, and thus, even when the contact hole is formed to overlap the emissive area, the emissive area may uniformly output light.

Moreover, according to the embodiments of the present disclosure, since the contact hole is formed to overlap the emissive area, an area of the emissive area does not depend on an area of the contact hole. As a result, according to the embodiments of the present disclosure, an area of the emissive area may be designed irrespective of an area of the contact hole, and thus, an area of the emissive area is maximized, thereby improving a lifetime of the organic light emitting layer.

Moreover, according to the embodiments of the present invention, since an area of the emissive area is maximized, an area of the non-emissive area is minimized. Accordingly, in a case where the embodiments of the present disclosure are applied to HMDs, the non-emissive area is prevented from being seen in a lattice pattern.

Moreover, according to the embodiments of the present disclosure, the bank may be formed to cover the inclined portion of the second planarization layer. Accordingly, according to the embodiments of the present disclosure, the organic light emitting layer may be thinly formed in the inclined portion of the second planarization layer, thereby preventing short circuit from occurring between the first electrode or the charge generating layer of the organic light emitting layer and the second electrode.

Furthermore, according to the embodiments of the present invention, each pixel may be provided in a square shape, and in this case, an area of the emissive area may be enlarged in the other direction (a lateral direction) as well as one direction (a vertical direction) in comparison with a case where each pixel is provided in a rectangular shape, whereby the emissive area may be further widened. Accordingly, according to the embodiments of the present disclosure, a lifetime of the organic light emitting layer is improved, and moreover, an area of the non-emissive area is minimized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
   a substrate including an emissive area that emits light and a non-emissive area that does not emit light;
   a transistor over the substrate;
   a first planarization layer over the transistor;
   a light emitting device over the transistor, the light emitting device including a first electrode, a light emitting layer on the first electrode, and a second electrode on the light emitting layer;
   a contact hole in the first planarization layer that is within the emissive area of the substrate, the contact hole positioned between the transistor and the light emitting device and exposing a portion of an electrode of the transistor;
   an auxiliary electrode on the first planarization layer and partially filling a portion of the contact hole, the auxiliary electrode electrically connecting together the first electrode of the light emitting device and the exposed portion of the electrode of the transistor; and
   a non-conductive second planarization layer on the auxiliary electrode, the non-conductive second planarization layer filling in a remaining portion of the contact hole.

2. The display device of claim 1
   wherein the first electrode of the light emitting device is on the second planarization layer and in contact with the second planarization layer.

3. The display device of claim 2, wherein a width of the second planarization layer is wider than a width of the contact hole and wherein the width of the second planarization layer is wider than the emissive area of the substrate.

4. The display device of claim 3, wherein a width of the first electrode of the light emitting device is wider than a width of the auxiliary electrode.

5. The display device of claim 2, wherein a width of the second planarization layer is equal to or narrower than a width of the contact hole.

6. The display device of claim 2, wherein a thickness of the second planarization layer is non-uniform.

7. The display device of claim 2, wherein a thickness of a portion of the second planarization layer is thicker than a thickness of the first planarization layer.

8. The display device of claim 2, wherein a portion of the second planarization layer is convexly shaped.

9. The display device of claim 2, further comprising:
   a first bank over a first overlapping portion of the auxiliary electrode, the second planarization layer, and the first electrode of the light-emitting device; and
   a second bank over a second overlapping portion of the auxiliary electrode, the second planarization layer, and the first electrode of the light-emitting device; and
   wherein a portion of the auxiliary electrode that is not covered by the first bank and second bank define a width of the emissive area.

10. The display device of claim 9, wherein the second planarization layer and the electrode of the light-emitting device included in the first overlapping portion and the second planarization layer and the electrode of the light-emitting device included in the second overlapping portion are inclined at an angle.

11. The display device of claim 9, wherein a thickness of the first bank and a thickness of second bank is uniform, and wherein the thickness of the first bank and the thickness of second bank are thicker than a distance between the first planarization layer and the light emitting layer of the light emitting device.

12. The display device of claim 9, wherein a thickness of the first bank is and a thickness of second bank is non-uniform, and wherein the thickness of the first bank and the thickness of second bank are thinner than a thickest portion of the second planarization layer.

13. The display device of claim 12, wherein portions of the light emitting device overlapping the first bank and the second bank are inclined at an angle corresponding to the non-uniform thicknesses of the first bank and the second bank.

14. The display device of claim 9, wherein a thickness of the first bank is thinner than a distance between an upper surface of the first planarization layer and the light emitting layer of the light emitting device in the emissive area.

15. The display device of claim 2, wherein a thickness of the second planarization layer filled in the contact hole is less than a thickness of the contact hole and the thickness of the second planarization layer is less than a thickness of the first planarization layer.

16. The display device of claim 1, wherein the auxiliary electrode is directly connected to both the first electrode of the light emitting device and the electrode of the transistor.

17. The display device of claim 1, wherein a width of the contact hole is narrower than the emissive area of the substrate.

18. A display device comprising:
a substrate including an emissive area that emits light and a non-emissive area that does not emit light;
a transistor over the substrate, the transistor including a first electrode, a second electrode, and a gate electrode;
a first planarization layer on the transistor;
a contact hole in a portion of the first planarization layer that is in the emissive area of the substrate, the contact hole exposing a portion of the first electrode of the transistor;
an auxiliary electrode over the first planarization layer, the auxiliary electrode filling in at least a portion of the contact hole and the auxiliary electrode in contact with the exposed portion of the first electrode of the transistor;
a second planarization layer on the auxiliary electrode, the second planarization layer filling in a remaining portion of the contact hole;
a light emitting device on the auxiliary electrode and over the second planarization layer, a first electrode of the light emitting device electrically connected to the first electrode of the transistor via the auxiliary electrode, and
wherein a first end of the first electrode of the light emitting device and a second end of the first electrode of the light emitting device are over the auxiliary electrode and in contact with the auxiliary electrode, and a portion of the first electrode of the light emitting device that is between the first end and the second end is in contact with the second planarization layer but lacks contact with the auxiliary electrode.

19. The display device of claim 18, further comprising a first bank over a first overlapping portion of the auxiliary electrode, the second planarization layer, and the first electrode of the light-emitting device; and
wherein a thickness of the first bank is thinner than a distance between an upper surface of the first planarization layer and the light emitting layer of the light emitting device in the emissive area.

20. A display device comprising:
a substrate including an emissive area that emits light and a non-emissive area that does not emit light;
a transistor over the substrate;
a light emitting device over the transistor, the light emitting device including a first electrode, a light emitting layer on the first electrode, and a second electrode on the light emitting layer;
a contact hole in the emissive area of the substrate, the contact hole positioned between the transistor and the light emitting device; and
an auxiliary electrode in the contact hole, the auxiliary electrode electrically connecting together the first electrode of the light emitting device and the transistor;
a first planarization layer over the transistor, the first planarization layer between the transistor and the light emitting device, and the contact hole disposed in the first planarization layer and exposing a portion of an electrode of the transistor;
a second planarization layer on the auxiliary electrode;
a first bank over a first overlapping portion of the auxiliary electrode, the second planarization layer, and the first electrode of the light-emitting device; and,
wherein a portion of the second planarization layer is convexly shaped in an upper direction,
wherein a thickness of the first bank is thinner than a distance between an upper surface of the first planarization layer and the light emitting layer of the light emitting device in the emissive area.

* * * * *